United States Patent

Huang et al.

(10) Patent No.: US 11,041,906 B2
(45) Date of Patent: Jun. 22, 2021

(54) OPTIMIZED SCAN CHAIN DIAGNOSTIC PATTERN GENERATION FOR REVERSIBLE SCAN ARCHITECTURE

(71) Applicant: Mentor Graphics Corporation, Wilsonville, OR (US)

(72) Inventors: Yu Huang, West Linn, OR (US); Szczepan Urban, Gowarzewo (PL); Wu-Tung Cheng, Lake Oswego, OR (US); Manish Sharma, Wilsonville, OR (US)

(73) Assignee: Siemens Industry Software Inc., Plano, TX (US)

( * ) Notice: Subject to any disclaimer, the term of this patent is extended or adjusted under 35 U.S.C. 154(b) by 6 days.

(21) Appl. No.: 16/548,921

(22) Filed: Aug. 23, 2019

(65) Prior Publication Data

US 2020/0333398 A1    Oct. 22, 2020

Related U.S. Application Data

(60) Provisional application No. 62/836,105, filed on Apr. 19, 2019.

(51) Int. Cl.
  *G01R 31/00* (2006.01)
  *G01R 31/3185* (2006.01)

(52) U.S. Cl.
  CPC ......... *G01R 31/318544* (2013.01); *G01R 31/318569* (2013.01)

(58) Field of Classification Search
  None
  See application file for complete search history.

(56) References Cited

U.S. PATENT DOCUMENTS

| | | | | |
|---|---|---|---|---|
| 5,915,084 A | * | 6/1999 | Wendell | G11C 7/06 365/201 |
| 6,990,076 B1 | * | 1/2006 | McNamara | G01R 31/318572 370/241 |
| 8,566,657 B2 | | 10/2013 | Goel | |
| 9,097,765 B1 | * | 8/2015 | Charlebois | G06F 11/267 |
| 9,222,978 B2 | | 12/2015 | Huang et al. | |
| 9,791,510 B2 | | 10/2017 | Goel | |
| 10,156,607 B2 | * | 12/2018 | Goel | G01R 31/318536 |
| 2009/0113263 A1 | * | 4/2009 | Cannon | G01R 31/318536 714/726 |

(Continued)

OTHER PUBLICATIONS

Authors et al., "Bidirectional Scan Chain for Digital Circuit Testing" IP.com No. IPCOM000160595D IP.com Electronic Publication Date: Nov. 21, 2007 (Year: 2007).*

(Continued)

*Primary Examiner* — Daniel F. McMahon

(57) ABSTRACT

A system and method for performing scan chain testing is disclosed. Scan cells, in the form of scan chains, are inserted into circuit designs for testing those circuit designs. The integrity of the scan chains is checked for defects before testing the circuit under test. In order to do so, various scan chain patterns, including one or both of U-turn and Z-turn patterns, are used in order to generate scan chain test data. The scan chain test data is analyzed in order to identify one or both of a type of defect (e.g., a timing fault, stuck-at fault, etc.) or a location of the defect. Further, the scan chain testing is performed using chain patterns with adaptive length.

23 Claims, 34 Drawing Sheets

(56) References Cited

U.S. PATENT DOCUMENTS

| | | | | |
|---|---|---|---|---|
| 2009/0113265 A1* | 4/2009 | Cannon | .......... | G01R 31/318544 |
| | | | | 714/729 |
| 2012/0233512 A1* | 9/2012 | Huang | ........... | G01R 31/318544 |
| | | | | 714/729 |
| 2017/0234925 A1* | 8/2017 | Kawoosa | ......... | G01R 31/31723 |
| | | | | 714/727 |

OTHER PUBLICATIONS

"Bidirectional Scan Chain for Digital Circuit Testing," IP.com No. IPCOM000160595D (2007).

Y. Huang and W.-T. Cheng, "On Designing Two-Dimensional Scan Architecture for Test Chips," International Symposium on VLSI Design, Automation and test (VLSI-DAT), 2017.

* cited by examiner

OPTIMIZED SCAN CHAIN DIAGNOSTIC PATTERN GENERATION FOR REVERSIBLE SCAN ARCHITECTURE

REFERENCE TO RELATED APPLICATION

This application claims the benefit of U.S. Provisional Application Ser. No. 62/836,105, filed on Apr. 19, 2019, the entirety of which is hereby incorporated herein.

FIELD

The present disclosure relates to the field of circuit testing and diagnosis, and specifically relates to scan architecture defect diagnosis.

BACKGROUND

Test chips are particularly helpful for semiconductor manufacturers to evaluate new technology, such as new fabrication processes. Various types of circuitry are available for the test chips. As one example, characterization vehicle (CV) test chips monitor yield with layout patterns, with placement of several hundred devices being arranged underneath probing pads. CV testing is effective but expensive. As another example, SRAM (static random-access memory) test chips may be used for ramping up, qualifying and monitoring new semiconductor fabrication processes. The transistor and circuit geometries used on an SRAM test chip, however, represent only a small fraction of the transistor and circuit geometries found in a real product.

As still another example, logic test chips (interchangeably referred to as logic circuit components hereinafter) narrow the gap between the SRAM chips and the real products and may be used to assist manufactures incorporate silicon-accurate models and enhance the manufacturing process. The logic test vehicle is more representative of an actual product, but may not be as easily testable and diagnosable as the SRAMs. The logic test chips capture information related to device and interconnect variability, including systematic and random variations, as well as manufacturing features used in lithography, thermal, stress, proximity effects; however, the logic test chips use all potentially to-be-used library cells.

Yet another example testing methodology is inline particle scanning. Early detection of systematic patterning problems may identify some types of defects and help improve process development by capturing yield-critical defect and metrology data. However, some defects may only be detected after wafers have been manufactured and have failed testing.

Still another testing methodology is Diagnosis Driven Yield Analysis (DDYA), which may improve yield in volume diagnosis. DDYA includes two major parts: (1) using various scan-based testing and diagnostic technologies can provide fast and accurate volume diagnosis data; and (2) applying subsequent statistical analysis on the volume diagnosis data in order to identify systematic defects and root causes. DDYA thus gives failure analysis engineers and yield engineers a very fast and highly effective way of defect localization and identification, complementing traditional, hardware-based methods.

One type of scan-based testing and diagnostics includes using scan chains, which are formed by scan cells being inserted into these circuit designs. However, because the scan chains themselves may be defective due to systematic or random manufacturing variations, the integrity of scan chains may be checked first before testing the circuit under test.

Scan chains and scan cells are built with logic circuit components and thus contain transistor and circuit geometries needed for test chips. Moreover, the functionality of a logic test chip is usually not a concern. Therefore, a logic test chip may be constructed mainly with scan chains, with the testing of the logic test chip focusing on testing the scan cells and their interconnections.

SUMMARY

In one embodiment, a method of scan chain diagnosis is disclosed. The method includes: loading a scan cell network with one or more scan chain patterns; unloading the scan cell network to collect scan chain test data; analyzing the scan chain test data in order to identify a timing fault in the scan cell network; and responsive to the analysis, identifying whether there is the timing fault in the scan cell network.

In another embodiment, a system for scan chain diagnosis is disclosed. The system includes one or more processors configured to perform the following method: loading a scan cell network with one or more scan chain patterns; unloading the scan cell network to collect scan chain test data; analyzing the scan chain test data in order to identify a timing fault in the scan cell network; and responsive to the analysis, identifying whether there is the timing fault in the scan cell network.

In still another embodiment, a method of scan chain diagnosis is disclosed. The method includes: loading a scan cell network with one or more scan chain patterns; unloading the scan cell network to collect scan chain test data; analyzing the scan chain test data in order to identify a stuck-at fault in a global signal in the scan cell network; and responsive to the analysis, identifying whether there is the stuck-at fault in the global signal in the scan cell network.

In another embodiment, a system for scan chain diagnosis is disclosed. The system includes one or more processors configured to perform the following method: loading a scan cell network with one or more scan chain patterns; unloading the scan cell network to collect scan chain test data; analyzing the scan chain test data in order to identify a timing fault in the scan cell network; and responsive to the analysis, identifying whether there is the timing fault in the scan cell network.

In yet another embodiment, a method of scan chain diagnosis using an adaptive chain pattern length is disclosed. The method includes: loading a section of a scan cell network with one or more first scan chain patterns having a first chain pattern length; unloading the section of the scan cell network to collect first chain test data responsive to loading the scan cell network with the one or more first scan chain patterns; selecting a second chain pattern length, the second chain pattern length being different from the first chain pattern length; loading the section of the scan cell network with one or more second scan chain patterns having the second chain pattern length; unloading the section of the scan cell network to collect second chain test data responsive to loading the scan cell network with the one or more second scan chain patterns; and analyzing the first chain test data and the second chain test data in order to identify a fault in the section of the scan cell network.

In another embodiment, a system for scan chain diagnosis is disclosed. The system includes one or more processors configured to perform the following method of scan chain diagnosis using an adaptive chain pattern length: loading a section of a scan cell network with one or more first scan chain patterns having a first chain pattern length; unloading the section of the scan cell network to collect first chain test data responsive to loading the scan cell network with the one or more first scan chain patterns; selecting a second chain pattern length, the second chain pattern length being different from the first chain pattern length; loading the section of the scan cell network with one or more second scan chain patterns having the second chain pattern length; unloading the section of the scan cell network to collect second chain test data responsive to loading the scan cell network with the one or more second scan chain patterns; and analyzing the first chain test data and the second chain test data in order to identify a fault in the section of the scan cell network.

In still another embodiment, a method of scan chain diagnosis is disclosed. The method includes: loading a scan cell network with one or more two-turn scan chain patterns; unloading the scan cell network to collect scan chain test data responsive to loading the scan cell network with one or more two-turn scan chain patterns; loading a scan cell network with one or more at least three-turn scan chain patterns; unloading the scan cell network to collect scan chain test data responsive to loading the scan cell network with one or more at least three-turn scan chain patterns; and analyzing the scan chain test data in order to identify a fault in the scan cell network.

In another embodiment, a system for scan chain diagnosis is disclosed. The system includes one or more processors configured to perform the following method: loading a scan cell network with one or more two-turn scan chain patterns; unloading the scan cell network to collect scan chain test data responsive to loading the scan cell network with one or more two-turn scan chain patterns; loading a scan cell network with one or more at least three-turn scan chain patterns; unloading the scan cell network to collect scan chain test data responsive to loading the scan cell network with one or more at least three-turn scan chain patterns; and analyzing the scan chain test data in order to identify a fault in the scan cell network.

BRIEF DESCRIPTION OF THE DRAWINGS

The accompanying drawings, which are incorporated in and constitute a part of this specification, illustrate various aspects of the invention and together with the description, serve to explain its principles. Wherever convenient, the same reference numbers will be used throughout the drawings to refer to the same or like elements.

DETAILED DESCRIPTION OF EMBODIMENTS

General Considerations

Figure 1:
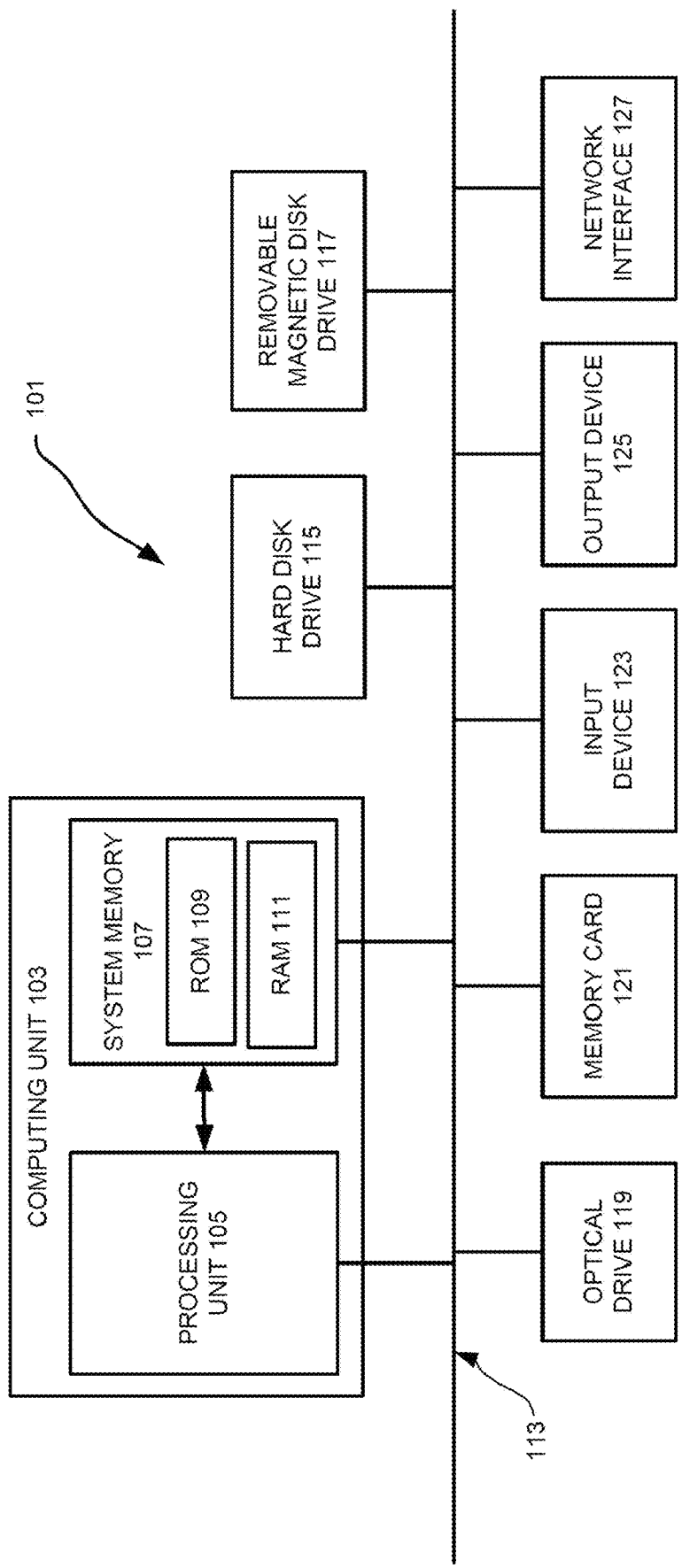
FIG. 1 illustrates an example of a computing device that may be used to implement various embodiments of the disclosed technology.

Various aspects of the present disclosed technology relate to techniques for scan chain testing. In particular, various methodologies for diagnosing errors in the scan chain architecture, and, in turn, improving physical failure analysis (PFA) and yield enhancement. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

As more fully explained below, embodiments of the disclosed technology may be performed or created by computer-executable instructions stored on one or more computer-readable media (e.g., tangible non-transitory computer-readable media such as one or more optical media discs, volatile memory or storage components (such as DRAM or SRAM), or nonvolatile memory or storage components (such as hard drives)) and executed on a computer. Such embodiments can be implemented, for example, as an electronic-design-automation (EDA) software tool (e.g., an automatic test pattern generation (ATPG) tool). Some of the disclosed techniques, for example, can be implemented as part of scan chain testing tool, including any one, any combination, or all of controlling scan chain architecture in order to input predetermined scan chains, recording outputs responsive to inputting the predetermined scan chains, or analyzing the outputs in order to determine one or more faults. Such methods can be executed on a single computer or on networked computers.

The computer-executable instructions can be part of, for example, a dedicated software application or a software application that is accessed or downloaded via a web browser or other software application (such as a remote computing application). Such software may be executed, for example, on a single local computer or in a network environment (e.g., via the Internet, a wide-area network, a local-area network, a client-server network (such as a cloud computing network), or other such network) using one or more network computers. For clarity, only certain selected aspects of the software-based implementations are described. Other details that are well known in the art are omitted. For example, it should be understood that the disclosed technology is not limited to any specific computer language, software tool, or computer. Any of the disclosed methods can alternatively be implemented (partially or completely) in hardware (e.g., an ASIC, PLD, or SoC).

Additionally, any circuit description or design file describing any of the disclosed apparatus or any data structure, data file, intermediate result, or final result created or modified using any of the disclosed methods can be stored on one or more computer readable storage medium (e.g., tangible non-transitory computer-readable media, such as one or more optical media discs, volatile memory or storage components (such as DRAM or SRAM), or nonvolatile memory or storage components (such as hard drives)).

Furthermore, any of the software-based embodiments (comprising, for example, computer-executable instructions which when executed by a computer cause the computer to perform any of the disclosed methods or to create design data for any of the disclosed apparatus) can be transmitted, received, or accessed through a suitable communication means. For example, a server computer can transmit to a client computer the computer-executable instructions for performing any of the disclosed methods or of creating design data for any of the disclosed apparatus (e.g., after the server receives request from the client computer to download the computer-executable instructions) Similarly, any circuit description, design file, data structure, data file, intermediate result or final result created or modified using any of the disclosed methods or describing an of the disclosed apparatus can be transmitted, received, or accessed through a suitable communication means. Such suitable communication means include, for example, the Internet, the World Wide Web, an intranet, software applications, cable (including fiber optic cable), magnetic communications, electromagnetic communications (including RF microwave, and infrared communications), electronic communications, or other communication means. Such communication means can be, for example, part of a shared or private network.

Additionally, any circuit description, design file, data structure, data file, intermediate result, or final result produced by any of the disclosed methods or describing any of the disclosed apparatus can be displayed to a user using a suitable display device (e.g., a computer monitor, touch screen, or other such display device). Such displaying can be performed as part of a computer-implemented method of performing any of the disclosed methods.

The disclosed methods or apparatus can be used or implemented at one or more stages of an overall design flow. Circuits manufactured using designs created or tested using embodiments of the disclosed technology are also considered to be within the scope of this disclosure. For example, a circuit design describing any of the disclosed testing environments can be fabricated into an integrated circuit using known microlithography techniques.

Any of the disclosed methods or apparatus can be performed or designed in an EDA environment. For presentation purposes, however, the present disclosure sometimes refers to a circuit-under-test (including the various components of the circuit under-test) and the associated testing hardware (including the various components of the hardware) by their physical counterparts (for example, scan chains, scan cells, ring generators, phase shifters, shadow registers, control gates, and other such terms). It should be understood, however, that any such reference not only includes the physical components but also includes representations of such components stored on non-transitory computer-readable media as are used in simulation, automatic test pattern generation, or other such EDA environments. For example, any of the disclosed apparatus can be described or represented as design data or design information stored on one or more computer-readable media. More specifically, any of the disclosed testing apparatus can be described or represented in an HDL file (such as a Verilog, VHDL, or register-transfer level file), a gate-level netlist, or other such EDA design file (e.g., a GDSII file or Oasis file). Such design data or design information can be created using an appropriate EDA software tool.

Illustrative Operating Environment

Various examples of the disclosed technology may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but it will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computing device 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it is not intended to be limiting. Various embodiments of the disclosed technology may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments of the disclosed technology may be implemented using a multi-processor computer, a plurality of single and/or multiprocessor computers arranged into a network, or some combination of both.

Circuit Testing

The reduction in feature size increases the probability that a manufacture defect in the integrated circuit results in a faulty chip. For example, a very small defect may result in a faulty transistor or interconnecting wire, potentially causing the entire chip to function improperly. Manufacture defects may be unavoidable nonetheless, regardless of whether the manufacturing process is at the prototype stage or the high-volume manufacturing stage. It is thus incumbent to test chips during the manufacturing process. Diagnosing faulty chips may also be warranted to ramp up and to maintain the manufacturing yield.

Testing typically includes applying a set of test stimuli (e.g., test patterns) to the circuit-under-test and then analyzing responses generated by the circuit-under-test. Functional testing attempts to validate that the circuit-under-test operates according to its functional specification while structural testing attempts to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (e.g., test pattern) generation to focus on testing a limited number of relatively simple circuit elements rather than having to address an exponentially exploding multiplicity of functional states and state transitions.

To simplify developing and applying test patterns, certain testability features may be added to circuit designs, which is referred to as design for test or design for testability (DFT). Scan testing is one DFT method. In a basic scan testing scheme, all or most of the internal sequential state elements (latches, flipflops, et al.) in a circuit design are made controllable and observable via an interface (e.g., a serial interface). These functional state elements are usually replaced with dual-purpose state elements called scan cells. Scan cells are connected together to form scan chains—serial shift registers for shifting in test patterns and shifting out test responses. A scan cell may operate as originally intended for functional purposes (functional/mission mode) and as a unit in a scan chain for scan (scan mode). A widely used type of scan cell include an edge-trigged flip-flop with two-way multiplexer for the data input. The two-way multiplexer is typically controlled by a single control signal called scan_enable, which selects the input signal for a scan cell from either a scan signal input port or a system signal input port. The scan signal input port is typically connected to an output of another scan cell while the system signal input port is connected to the functional logic. Scan cells may serve as both a control point and an observation point. Control points can be used to set certain logic values at some locations of the circuit-under-test, exciting a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG may focus on a set of faults derived from a gate-level fault model. As discussed above, a defect may be resident in a device and created during the manufacturing process. A fault model is a description of how the defect alters design behavior. In other words, a defect is a flaw or physical imperfection that may lead to a fault. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a fault site is said to be detected by a test pattern if a test response value captured by a scan cell or a primary output is different than the expected value. In this regard, the objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which may be directly proportional to test application time. Here, the fault coverage is defined as a ratio of the number of detected faults vs. the total number of faults.

Various fault models, manifesting as scan cell internal defects and/or scan cell external defects, are contemplated. For example, one fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. As another example, delay faults cause errors in the functioning of a circuit based on its timing. Specifically, delay faults are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period.

During the circuit design and manufacturing process, a manufacturing test screens out chips (e.g., dies) containing defects. The test itself, however, may not identify the reason for the unacceptable low or fluctuating yield that may be observed. Physical failure analysis (PFA) may inspect the faulty chip to locate the defect location(s) and to discover the root cause. The process may include etching away certain layers and then imaging the silicon surface by scanning electronic microscopy or focused ion beam systems. This PFA process is laborious and time consuming. To facilitate the PFA process, diagnosis is often employed to narrow down possible locations of the defect(s) based on analyzing the fail log (e.g., fail file, failure file). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Diagnosis includes logic diagnosis (sometimes referred to as scan diagnosis or diagnosis) and chain diagnosis. Logic diagnosis may employ a fault dictionary or directly examine the syndrome (i.e., the effect) of the failing chip to determine likely defect locations (defect suspects). The latter approach may include structural pruning (backtracing), fault injection and evaluation (fault simulation for both failing and passing test patterns). The quality of diagnosis can be measured by diagnostic resolution (e.g., the number of the real defects vs. the number of the defect suspects). Diagnostic resolution is linked not only to the algorithm used for diagnosis but also to the test patterns used for the manufacturing test (manufacturing test patterns). To enhance the diagnosis quality, a diagnostic test pattern generation process may be employed. This process generates test patterns that can refine the set of defect suspects.

Chain diagnosis determines scan cells that are likely to be defective. Scan elements and related clocking circuitry can take up about 30% of silicon area of an integrated circuit chip. It has been reported that scan chain failures account for almost 50% of chip failure in some cases. Chain diagnosis is thus important to guide physical failure analysis and yield learning process. In a chain diagnosis process, two types of test patterns may be used. The first type is called chain patterns. A chain pattern is a pattern used in a process comprising shift-in and shift-out without pulsing capture clocks. The other type is often referred to as scan patterns (interchangeable referred to as a scan chain pattern). A scan pattern is a pattern used in a process comprising shift-in, one or multiple capture clock cycles, and shift-out, and the scan patterns include patterns generated by ATPG for testing system logic, special chain diagnostic patterns generated only for scan chain diagnosis purpose and some special functional patterns. Chain patterns can be used to test the integrity of scan chains and/or determine fault models associated with faulty scan chains while scan patterns can be used to inject certain values to some scan cells for locating defective scan cells. Some techniques for chain diagnosis are disclosed in U.S. Pat. Nos. 7,788,561; 8,615,695; 8,316,265; 8,689,070; 8,843,796; 9,086,459; and 9,222,978, all of which are hereby incorporated by reference herein in their entirety.

Test application in chip manufacturing test is normally performed by automatic test equipment (ATE) (a type of testers). Scan-based tests consume significant amounts of storage and test time on ATE. The data volume increases with the number of logic gates on the chip and the same holds for the number of scan cells. Yet, practical considerations and ATE specifications often limit both the number of pins available for scan in/out and the maximum scan frequency. It is highly desirable to reduce the amount of test data that need to be loaded onto ATE and ultimately to the circuit under test. Fortunately, test patterns are compressible mainly because only 1% to 5% of test pattern bits are typically specified bits (care bits) while the rest are unspecified bits (don't-care bits). Unspecified bits can assume any values with no impact on the fault coverage. Test compression may also take advantage of the fact that test cubes tend to be highly correlated. A test cube is a deterministic test pattern in which the don't-care bits are not filled by ATPG. The correlation exists because faults are structurally related in the circuit.

Various test compression techniques have been developed. In general, additional on-chip hardware before and after scan chains is inserted. The hardware (e.g., decompressor) added before scan chains is configured to decompress test stimulus coming from ATE, while the hardware (e.g., compactor) added after scan chains is configured to compact test responses captured by the scan chains. The decompressor expands the data from n tester channels to fill greater than n scan chains. The increase in the number of scan chains shortens each scan chain and thus reduces the number of clock cycles needed to shift in each test pattern. Thus, test compression can reduce not only the amount of data stored on the tester but also the test time for a given test data bandwidth.

The embedded deterministic test (EDT) is one example of test compression techniques. The EDT-based compression is composed of two complementary parts: hardware that is embedded on chip, and deterministic ATPG software that generates compressed patterns that utilize the embedded hardware. The EDT hardware features a continuous-flow decompressor. The EDT compression of test cubes is performed by treating the external test data as Boolean variables. Scan cells are conceptually filled with symbolic expressions that are linear functions of input variables injected into the decompressor. In the case of a decompressor comprising a ring generator and an associated phase shifter, a set of linear equations corresponding to scan cells whose values are specified may be used. A compressed pattern can be determined by solving the system of equations. If the compressed pattern determined as such is then scanned in through the decompressor, the bits that were specified by ATPG are generated accordingly. Unspecified bits are set to pseudorandom values based on the decompressor architecture. Additional details concerning EDT-based compression and decompression are found in J. Rajski, J. Tyszer, M. Kassab, and N. Mukherjee, "Embedded deterministic test," IEEE Trans. CAD, vol. 23, pp. 776-792, May 2004, and U.S. Pat. Nos. 6,327,687; 6,353,842; 6,539,409; 6,543,020; 6,557,129; 6,684,358; 6,708,192; 6,829,740; 6,874,109; 7,093,175; 7,111,209; 7,260,591; 7,263,641; 7,478,296; 7,493,540; 7,500,163; 7,506,232; 7,509,546; 7,523,372; 7,653,851, all of which are hereby incorporated by reference herein in their entirety.

Logic built-in self-test (Logic BIST) is a DFT technique that permits a circuit to test itself using embedded test logic without the need of an external tester. Classical Logic BIST applications include detecting infant mortality defects during burn-in test, enabling the use of low-cost and/or low-speed testers that only provide power and clock signals, and in-system self-testing to improve the reliability of the system in aerospace/defense, automotive, telecommunications and healthcare industries. A typical logic BIST system includes a test pattern generator for automatically generating test patterns, a test response analyzer (compactor) for compacting test responses into a signature and a logic BIST controller for coordinating the BIST operation and for providing a pass/fail indication. A pseudo-pattern pattern generator (PRPG), a commonly used test pattern generator, can be constructed from a linear feedback shift register (LFSR) or a cellular automaton. To increase the fault coverage, a weighted LFSR may be employed. Another approach combines random test patterns with deterministic patterns in some fashion as the BIST logic can be used to handle compressed test patterns that are generated deterministically and stored on chip.

Test points can also be used to increase the fault coverage for logic BIST by improving the probability of detecting random-resistant faults. Test point insertion (TPI) algorithms select hard-to-control and hard-to-observe sites to insert control and observation points. When active, a control point forces a circuit's node to a specific logic value, whereas an observation point acts as a pseudo-primary output. To identify the most effective test points while minimizing their total number and a possible impact on a design performance, numerous approximate techniques have been proposed. These TPI algorithms may be guided by exact fault simulation, approximate testability measures, cost functions, gradient-based metrics, or signal correlation.

Test points may be used to decrease deterministic pattern counts as well. For example, a test point insertion algorithm can aim at identifying and resolving conflicts between ATPG-assigned internal signals through insertion of conflict-aware test points to increase the number of faults detected by a single pattern. A hybrid test point insertion method is recently developed to simultaneously reduce deterministic test pattern counts and increase detectability of random-resistant faults by resolving cases where demands of internal nets for a given logic value come up against very low likelihood of getting this value with pseudorandom tests. Details concerning the hybrid test point insertion method can be found in E. Moghaddam et al., "Test point insertion in hybrid test compression/LBIST architectures," 2016 IEEE International Test Conference (ITC), paper 2.1.

All of the above mentioned processes, design insertion for testing, test pattern generation, test compression, and logic and chain diagnosis, may be performed by various electronic design automation tools.

Scan Chain Testing

As discussed above, DDYA may be used in scan chain testing. In particular, in a DDYA methodology, software-based scan chain diagnosis may be applied either to test chips or in volume manufacturing. The DDYA methodology may report faults in the scan chain architecture, such as faulty scan cells, with acceptable diagnostic resolution (e.g., reporting a defect at a resolution down to one suspect cell), thereby assisting in Physical Failure Analysis (PFA) and yield improvement. To capitalize on the DDYA methodology, specific reversible scan chain patterns, configured to identify one or more types of faults, may be used to achieve the acceptable diagnostic resolution, as discussed further below. Further, the DDYA methodology may be used in a variety of scan chain architectures, including 1-dimensional and 2-dimensional scan chain architectures.

The DDYA methodology may identify one or more types of defects, such as cell internal defects and/or cell external defects. As one example, the DDYA methodology may identify cell internal defects such as stuck-at faults. As another example, the DDYA methodology may identify cell external defects such as on the scan path that is shared by bidirectional shift paths (e.g., the output pin on the MUX control by DIR; scan cell output before fanout to different paths; etc.) and/or on unidirectional shift paths. As yet another example, the DDYA methodology may identify cell external defects such as from a global signal (e.g., identifying stuck-at fault in a global signal, such as a clock signal, a DIR, scan enable signal, etc.).

Alternatively, or in addition to identifying stuck-at faults, the DDYA methodology may identify timing faults on the scan paths. Timing faults may include any one, any combination, or all of: transition fault; delay fault; or hold time fault. For example, transition faults may comprise a single-sided fault, such as a fast-to-rise fault (that only corrupts "10" transitions) or a fast-to-fall fault (that only corrupts "01" transitions). As another example, hold time faults may be caused by: a scan path delay that is too small; or a clock skew that is too large (e.g., extra clock skew). In addition to identifying the type of fault (or defect), the scan chain testing methodology may identify the location of the fault (or defect). For example, responsive to identifying an error value in a respective cell, the methodology may identify whether the error value is caused by a defect within the respective cell or external to the respective cell (e.g., in the scan chain path or in another scan chain cell).

Various scan chain patterns may be used to diagnose faults, including timing faults. As one example, a scan chain pattern with at least three turns (e.g., a three-turn pattern, a four-turn pattern, a five-turn pattern, etc.) may comprise at least a first turn, a second turn, and a third turn, and may be used to diagnose timing faults. The at least three turns scan chain pattern may be used in combination with another type of scan chain pattern, such as a two turn (e.g., a U-pattern) scan chain pattern. As discussed in further detail below, a two turn scan chain pattern may first be used to identify an error value in one or more scan chain cells in the scan chain; thereafter, the at least three turns pattern may be used to further characterize the error in the scan chain (e.g., one or both of the type of fault or defect and/or the location of the fault or defect in the scan chain).

With regard to the at least three turns scan chain pattern, at least one of the first turn, the second turn, or the third turn has a different direction than a remainder of patterns in the three-turn pattern. For example, in the context of a one-dimensional scan cell network, the first turn and the third turn is in a first direction (e.g., left to right, or right to left) and the second turn is in a second direction that is opposite the first direction (e.g., right to left, or left to right). Further, the first turn and the third turn may each shift the same number of cycles (such as N cycles), whereas the second turn may shift a different number of cycles (such as M cycles, where M≠N). In a more specific embodiment, M<N such that the three-turn pattern comprises a Z-turn pattern. As discussed in further detail below, the number of M cycles shifted may be selected in order to determine the location of the fault or defect.

As another example, in the context of a two-dimensional scan cell network, one or more of the turns may be in a first orientation (horizontal direction or vertical direction) and a remainder of the turns may be in a second orientation (vertical direction or horizontal direction). In one particular example, a three-turn pattern may horizontal (e.g., right to left or left to right)/vertical (up to down or down to up)/vertical (in the opposite direction: down to up or up to down). In another particular example, a three-turn pattern may vertical (up to down or down to up)/horizontal (e.g., right to left or left to right)/horizontal (in the opposite direction: left to right or right to left). In yet another particular example, a three turn pattern may be horizontal (left to right or right to left)/vertical (up to down or down to up)/horizontal (in the same direction as the first horizontal turn: left to right or right to left). In still another particular example, a three turn pattern may be vertical (up to down or down to up)/horizontal (left to right or right to left)/vertical (in the same direction as the first vertical turn: up to down or down to up). Further, the the first turn and the third turn is in a first direction (e.g., left to right, or right to left) and the second turn is in a second direction that is opposite the first direction (e.g., right to left, or left to right). Further, in one or some embodiments, each of the turns in the at least three-turn pattern for a two-dimensional scan cell network may shift the same number of cycles. Alternatively, the turns in an at least three-turn pattern for a two-dimensional scan cell network may shift a different number of cycles. For example, the first turn and the third turn may each shift the same number of cycles (such as N cycles), whereas the second turn may shift a different number of cycles (such as M cycles, where M≠N). In one or some embodiments, M<N whereas in other embodiments M>N.

For example, a pair of at least three-turn patterns may be used to diagnose a single-sided fault. In particular, a pair of Z-turn patterns may be used to bound the defect location if some faulty transitions pass the defect in one pattern, but do not pass the defect location in another pattern. As another example, the Z-turn pattern may be used to identify a hold-time defect location, as discussed further below. Likewise, various Z-turn patterns may be used to identify a delayed clock defect location, as discussed further below.

Figure 2A:
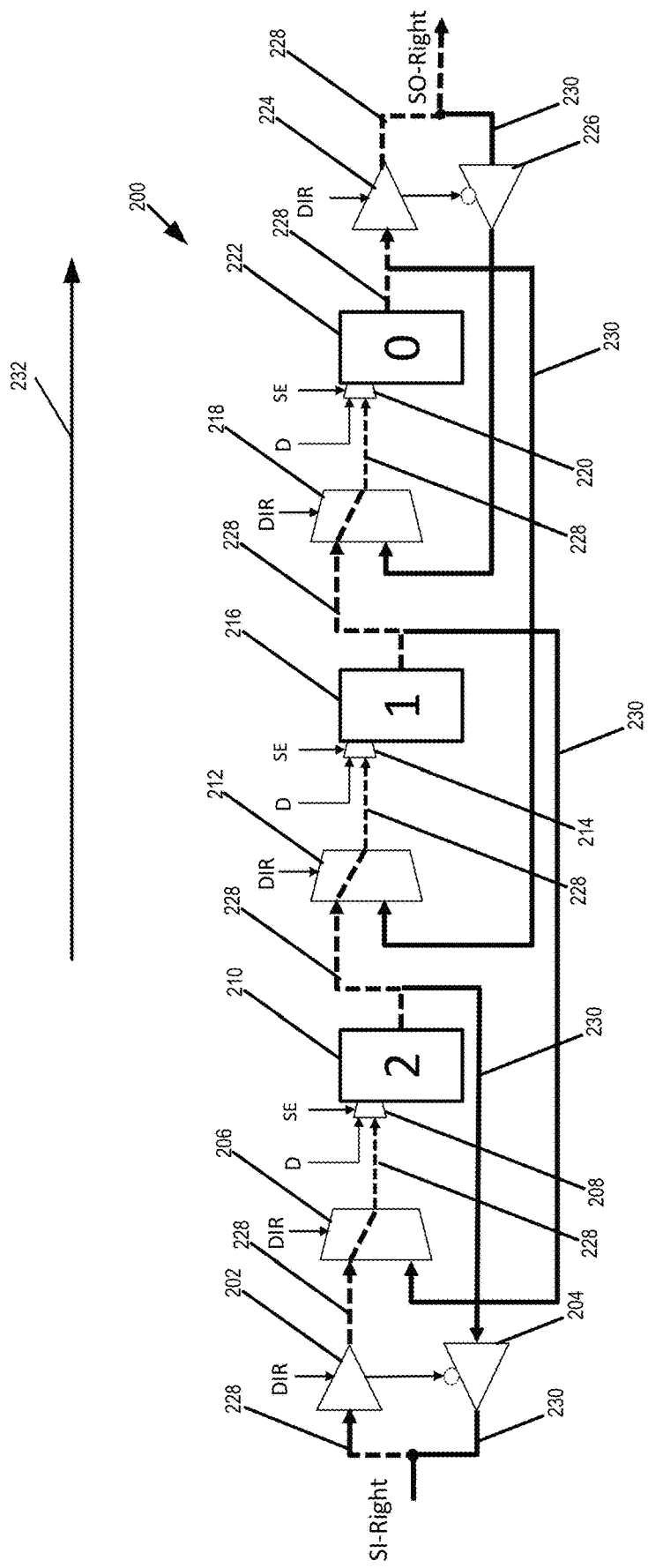
FIG. 2A illustrates a first example block diagram of a reversible scan chain L2R (left to right) shift with two shift paths.
Figure 2B:
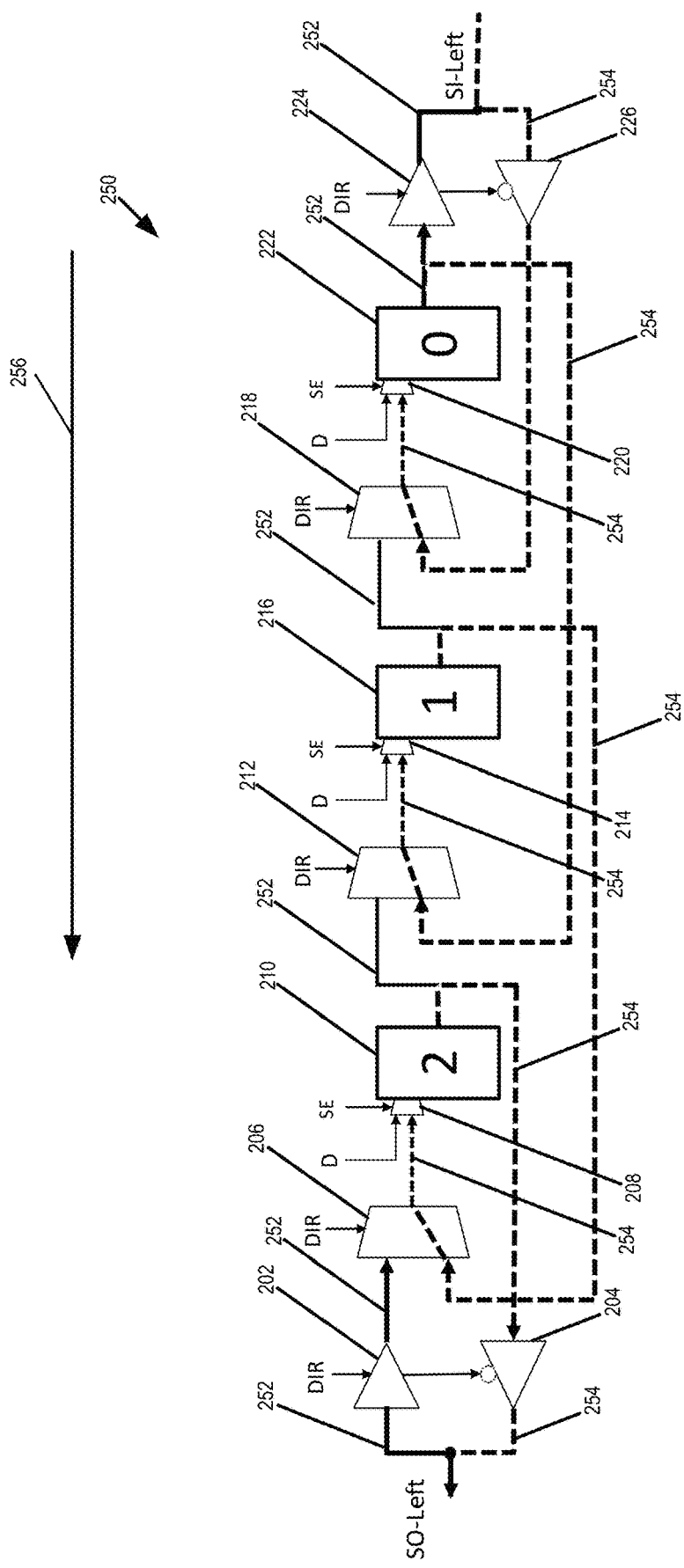
FIG. 2B illustrates a first example block diagram of a reversible scan chain R2L (right to left) shift with two shift paths.

Referring back to the figures, FIG. 2A illustrates a first example block diagram 200 of a reversible scan chain L2R (denoted as "left to right") shift as indicated by arrow 232 with two shift paths. FIG. 2B illustrates a first example block diagram 250 of a reversible scan chain R2L (denoted as "right to left") shift as indicated by arrow 256 with two shift paths. Various inputs are illustrated in FIGS. 2A-B including DIR, SE, and D. DIR ("direction") determines the direction of the scan path (e.g., L2R or R2L). Further, SE ("scan enable") determines whether the circuitry is in test mode or whether the circuitry is in functional mode. For example, when SE=0, the circuitry may be configured for normal operational mode. Conversely, when SE=1, the circuitry is in test mode whereby test data is input using the scan chain from the tester. FIGS. 2A-B includes pass transistors 202, 204, 224, 226 that input DIR or DIR (complement), multiplexers (MUXs) 206, 208, 212, 214, 218, 220, and Cell 0 (222), Cell 1 (216) and Cell 2 (210).

In one or some embodiments, a bidirectional scan chain architecture may be used in which the scan chain performs both forward and backward scan shift to diagnose scan faults. Thus, generally speaking, each scan cell may receive shift values from its neighbor cell either on its left or on its right. Hence, the scan chain may be stitched together in both directions, enabling shifting scan data from L2R and/or R2L, by controlling of a signal DIR. A simple scan chain example with 3 scan cells is illustrated in FIGS. 2A-B. The scan path (illustrated as 228 as a dashed line) in FIG. 2A indicates L2R shift from Cell 2 (210) to Cell 0 (222), whereas the scan path (illustrated as 254 as a dashed line) in FIG. 2B indicates R2L shift from Cell 0 (222) to Cell 2 (210). The scan paths, illustrated as 230 in FIG. 2A and as 252 in FIG. 2B, are not active The reversible scan architecture illustrated in FIGS. 2A-B may be implemented in a variety of ways; however, the reversible scan architecture may shift in both directions. If the area overhead is acceptable, not only may the reversible scan architecture be applied to test chips, but may also be applied for use in volume manufacturing. As discussed further below, certain chain patterns may be used in order to achieve the perfect diagnostic resolution.

As discussed above, various faults may be diagnosed. As one example, reversible diagnostic chain patterns may be used to diagnose cell internal stuck-at faults. For advanced technologies, most of the defects are cell internal defects. Among these defects, the majority of them may be modeled as stuck-at faults. Hence, one focus for chain diagnosis targets are the cell internal stuck-at faults. Most of such defects may be triggered in both shift directions, as long as the shifted value is opposite to the stuck-at value.

In one or some embodiments, several chain patterns, with static length, may be used for diagnosing stuck-at faults. As one example, all "1" chain patterns may be used to diagnose stuck-at-0 fault, and all "0" chain patterns may be used to diagnose stuck-at-1 fault. In particular, U-turn scan chain patterns (e.g., a two-turn scan chain pattern), which includes a first turn in one direction and a second turn in an opposite direction, may be used. The number of shifts in the first turn may be the same as the number of shifts in the second turn. In one or some embodiments, multiple chain patterns may be used for diagnosing stuck-at faults including: (i) all "1" pattern with first shift N cycles L2R, where N is the scan chain length, then make a U-turn to shift N cycles R2L. Such patterns may be denoted as $LRL_{1111}$..., where LRL may be broken down into two shifts, with a first shift left to right (denoted by the $1^{st}$ and $2^{nd}$ letters "LR") and with a second shift right to left (denoted by the $2^{nd}$ and $3^{rd}$ letters "RL"). Further, the "1" pattern is illustrated in the subscript. Other patterns may include: (ii) $LRL_{0000}$...; (iii) $RLR_{1111}$...; and (iv) $RLR_{0000}$....

Figure 3A:
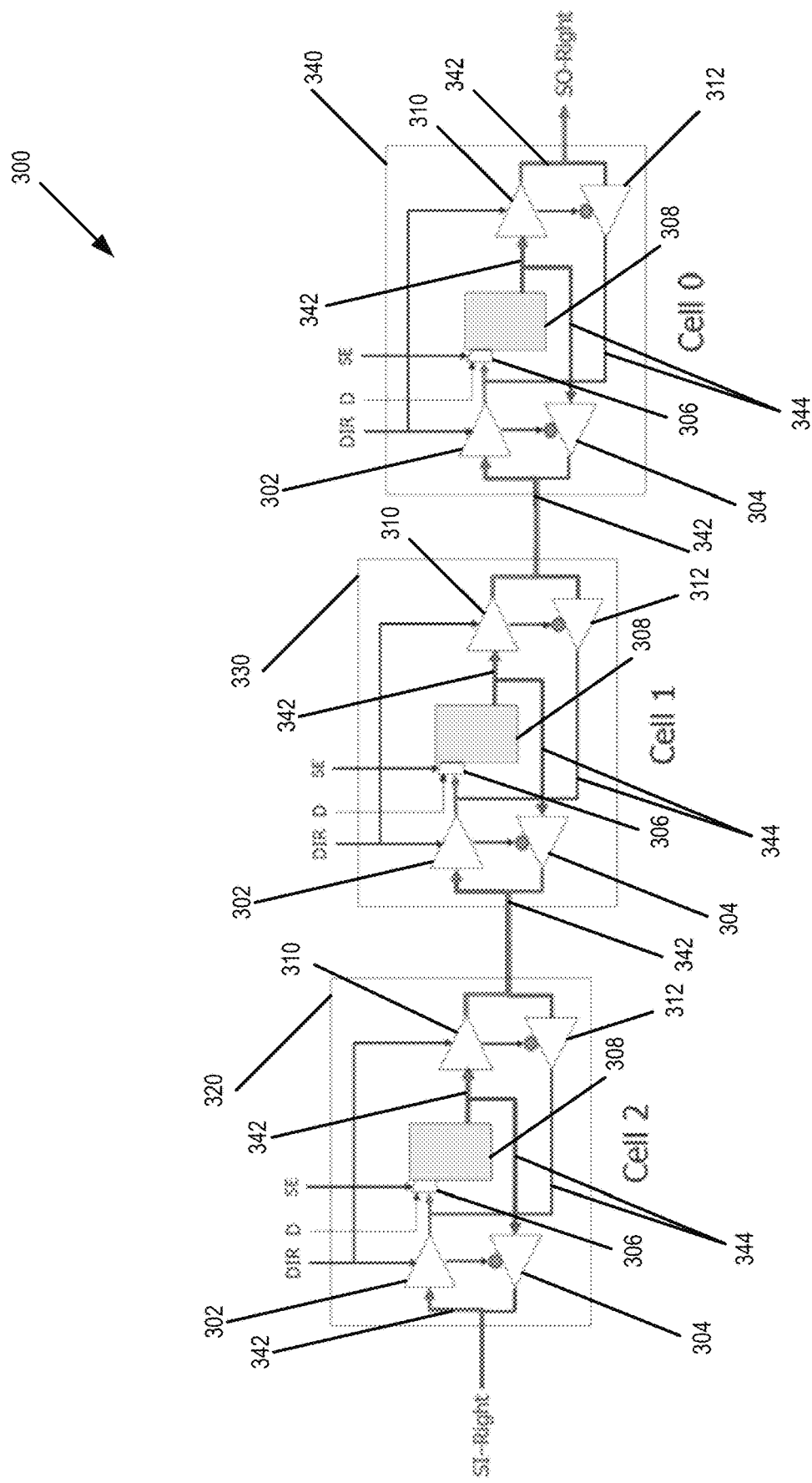
FIG. 3A illustrates a second example block diagram of a reversible scan chain L2R (left to right) shift with two shift paths.
Figure 3B:
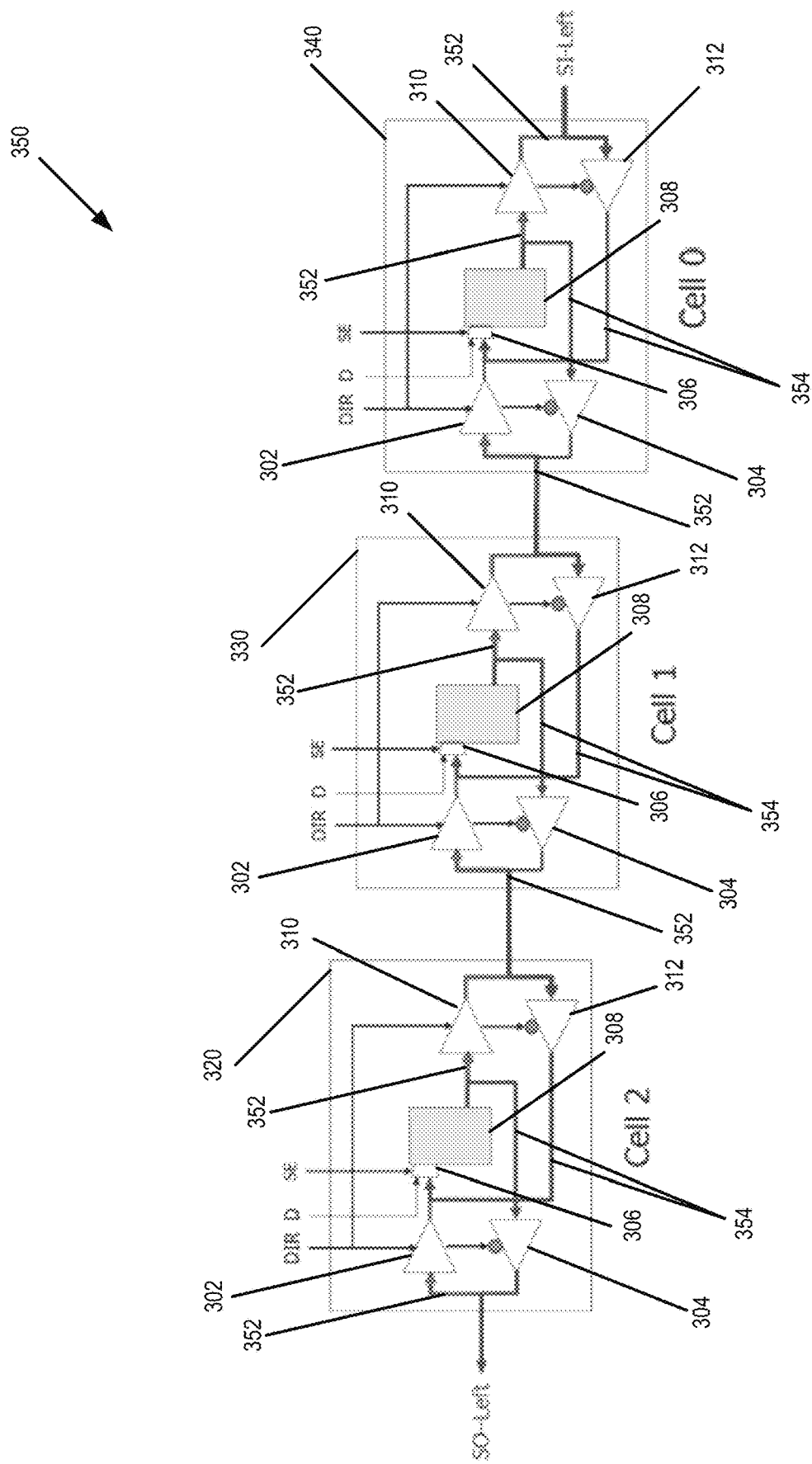
FIG. 3B illustrates a second example block diagram of a reversible scan chain R2L (right to left) shift with two shift paths.
Figure 6:
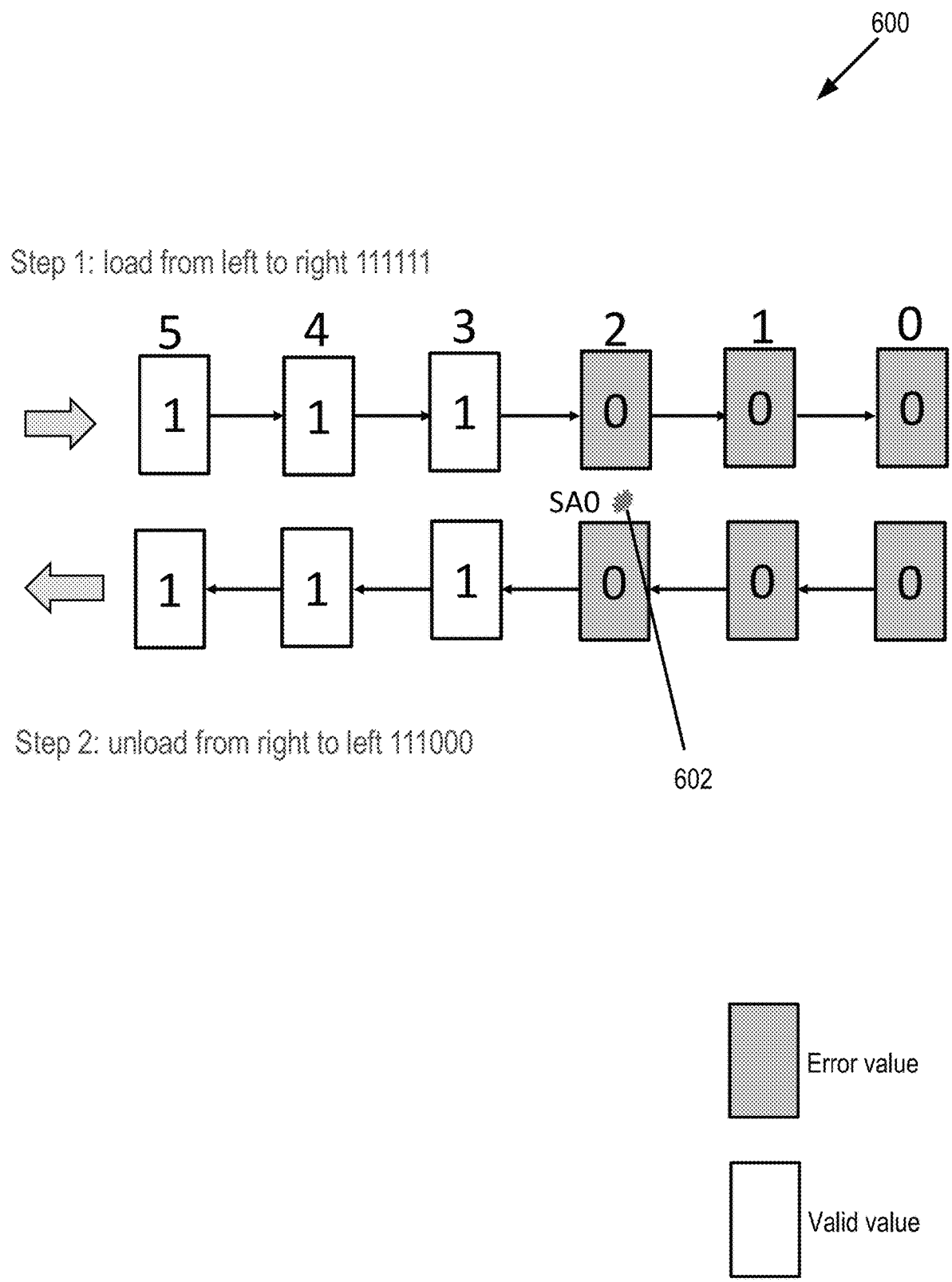
FIG. 6 illustrates an example block diagram of testing using a first scan chain pattern ($LRL_{111111}$).

FIG. 3A illustrates a second example block diagram 300 of a reversible scan chain L2R (left to right) shift with two shift paths (342, 344) and Cell 0 (340), Cell 1 (330), and Cell 2 (320). FIG. 3B illustrates a second example block diagram 350 of a reversible scan chain R2L (right to left) shift with two shift paths (352, 354). Further, FIGS. 3A-B includes pass transistors 302, 304, 310, 312 that input DIR or DIR (complement), multiplexers (MUXs) 306, and scan cell circuitry 308. Using the configuration in FIG. 3A, all "1" pattern is shifted from left to right (as shown in the block diagram 600 of FIG. 6). Assuming Cell 2 has a stuck-at-0 fault 602 in FIG. 6), the loaded values will be "111000". Then, using the configuration of FIG. 3B, the shift direction is changed to unload the pattern from right to left in order to obtain chain test data. As shown in FIG. 6, the system observes "111000" as the scan chain test data at the scan chain output on the left. Since the first failure is observed at Cell 2, the system may ascertain that Cell 2 has a stuck-at-0 fault at 602. In case the architecture has multiple stuck-at-0 faults on this scan chain (as illustrated below with regard to FIG. 9A), pattern (i) $LRL_{1111}$ . . . may locate the leftmost stuck-at-0 cell. Conversely, pattern (ii) $LRL_{0000}$ . . . may locate the leftmost stuck-at-1 cell, pattern (iii) $RLR_{1111}$ . . . may locate the rightmost stuck-at-0 cell, and pattern (iv) $RLR_{0000}$ . . . may locate the rightmost stuck-at-1 cell.

It is noted that if a scan chain has more than two stuck-at faults, using the above four patterns (i), (ii), (iii) and (iv), the system may only diagnose two faults at both ends of one faulty chain. To diagnose the other faults between the end faults, a 2-D scan chain architecture may be used. Typically, diagnosing two end faults per chain may be sufficient to assist running PFA and improving yield. Further, if the system is configured to only diagnose one defective cell on a chain, the system need only use two patterns (rather than the four described above), such as using (i) $LRL_{1111}$ . . . to cover stuck-at-0 and (ii) $LRL_{0000}$ . . . to cover stuck-at-1 or such as using (iii) $RLR_{1111}$ . . . to cover stuck-at-0 and (iv) $RLR_{0000}$ . . . to cover stuck-at-1.

Figure 7:
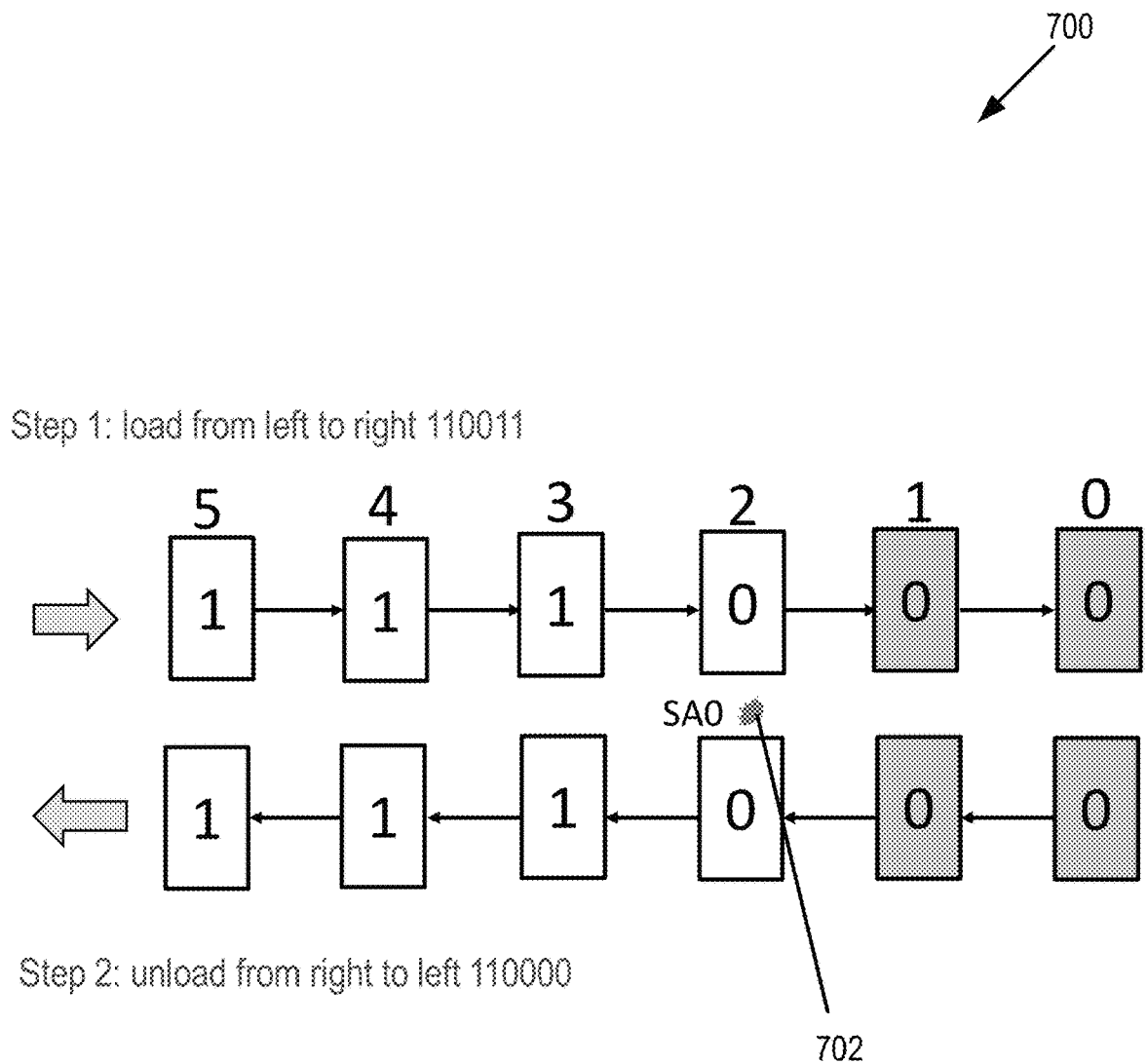
FIG. 7 illustrates an example block diagram of testing using a second scan chain pattern ($LRL_{110011}$).
Figure 7:
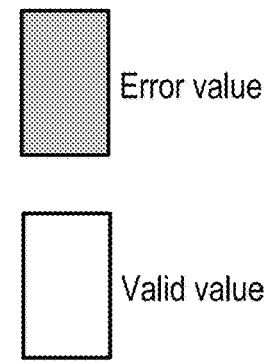

Further, if all "0" or all "1" chain patterns are difficult to generate, for example due to scan cell constraints, other patterns may be used. As one example, pattern $LRL_{110011}$ is illustrated in the block diagram 700 in FIG. 7. As shown, the resolution of stuck-at-0 fault (SA0 702) is not perfect because the system cannot distinguish the stuck-at-0 fault at cell 2 and cell 3. Therefore, the system may surmise that the reported suspect cells are {2, 3}. However, the system may compensate for this situation by using a complement pattern $LRL_{001100}$, hence leading to perfect diagnostic resolution. In such a situation, the system may still use four patterns per scan chain to achieve perfect resolution to detect faults at both ends on this chain, e.g., (i) $LRL_{11001100}$ . . . , (ii) $LRL_{00110011}$ . . . , (iii) $RLR_{11001100}$ . . . and (iv) $RLR_{00110011}$ . . . .

Figure 8:
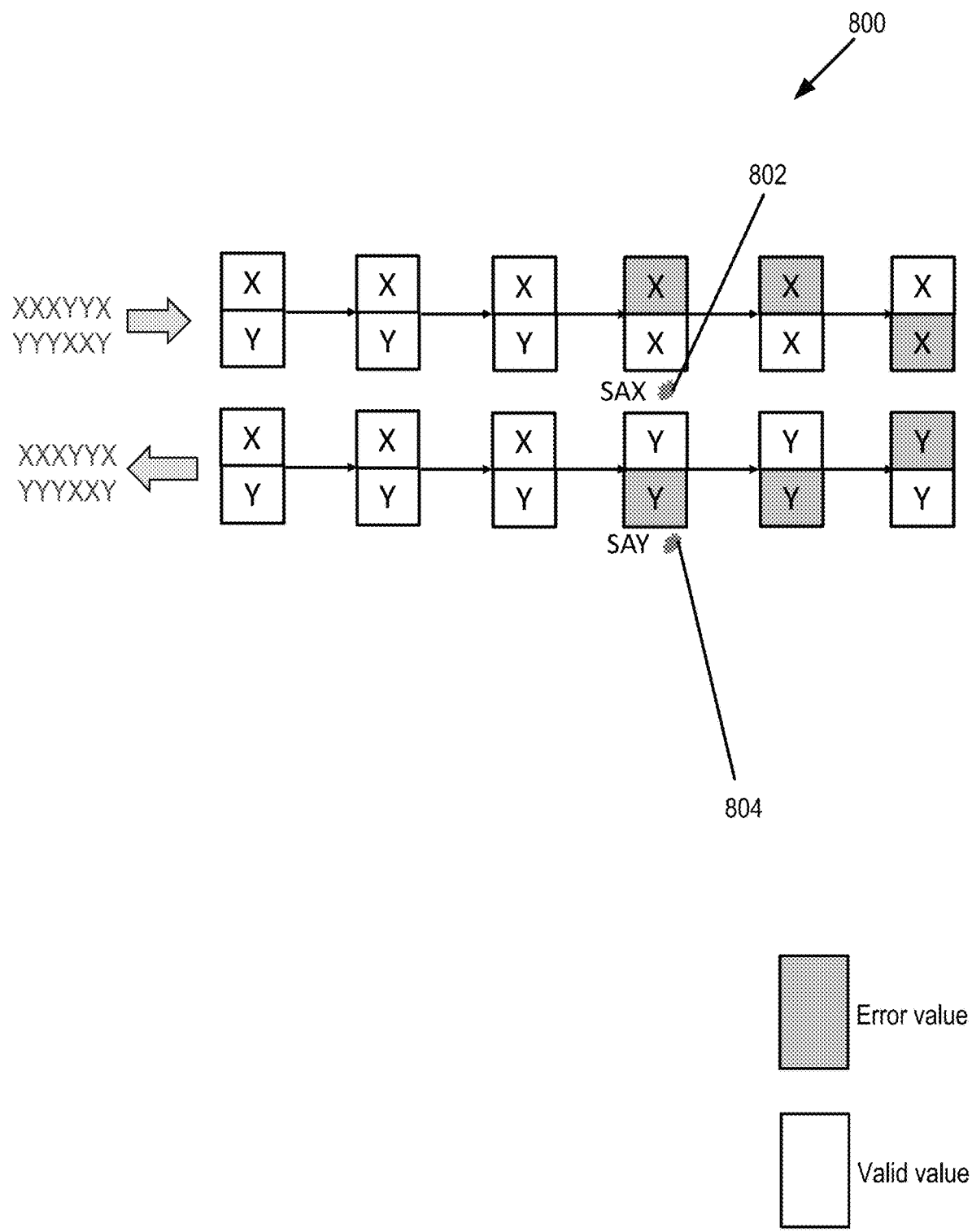
FIG. 8 illustrates an example block diagram of testing using a complementary scan chain pattern.

Further, generally speaking, as long as the pair of LRL (or RLR) patterns are complementary to each other, the system may reliably achieve the perfect diagnostic resolution. As illustrated in the block diagram 800 in FIG. 8, regardless of a stuck-at-X (SAX 802) or stuck-at-Y (SAY 804) fault (where X=0 and Y=1, or X=1 and Y=0), the system may identify failure of one of complementary patterns at the defective cell. In this regard, the system may use the information to pinpoint the defective location. Therefore, in one or some embodiments, the system may use complementary patterns, such as arbitrary two complementary LRL patterns plus arbitrary two complementary RLR patterns, in order to achieve perfect diagnostic resolution.

Figure 9A:
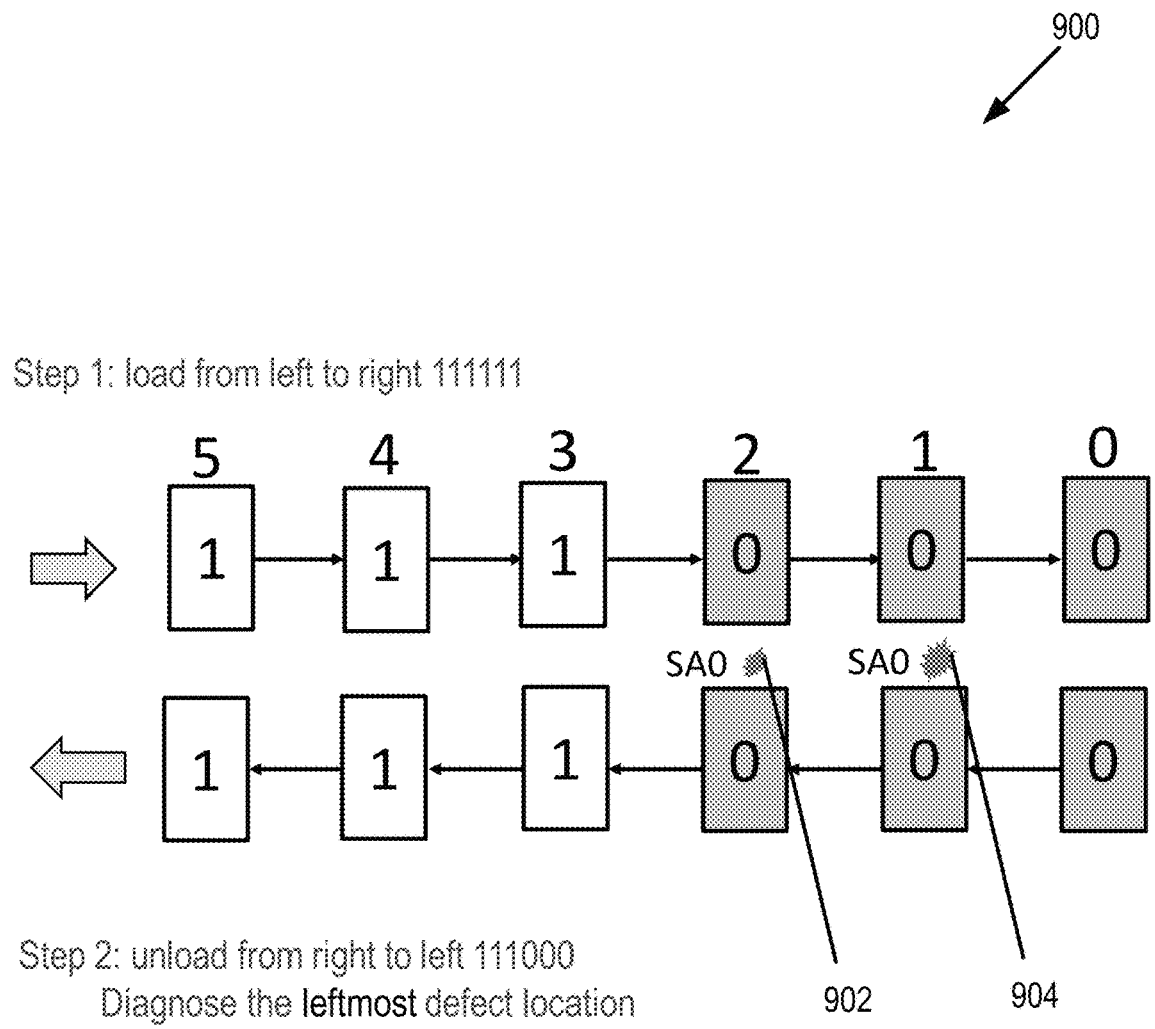
FIGS. 9A-B illustrate example block diagrams of testing using a static length pattern with a 4-step flow.
Figure 9B:
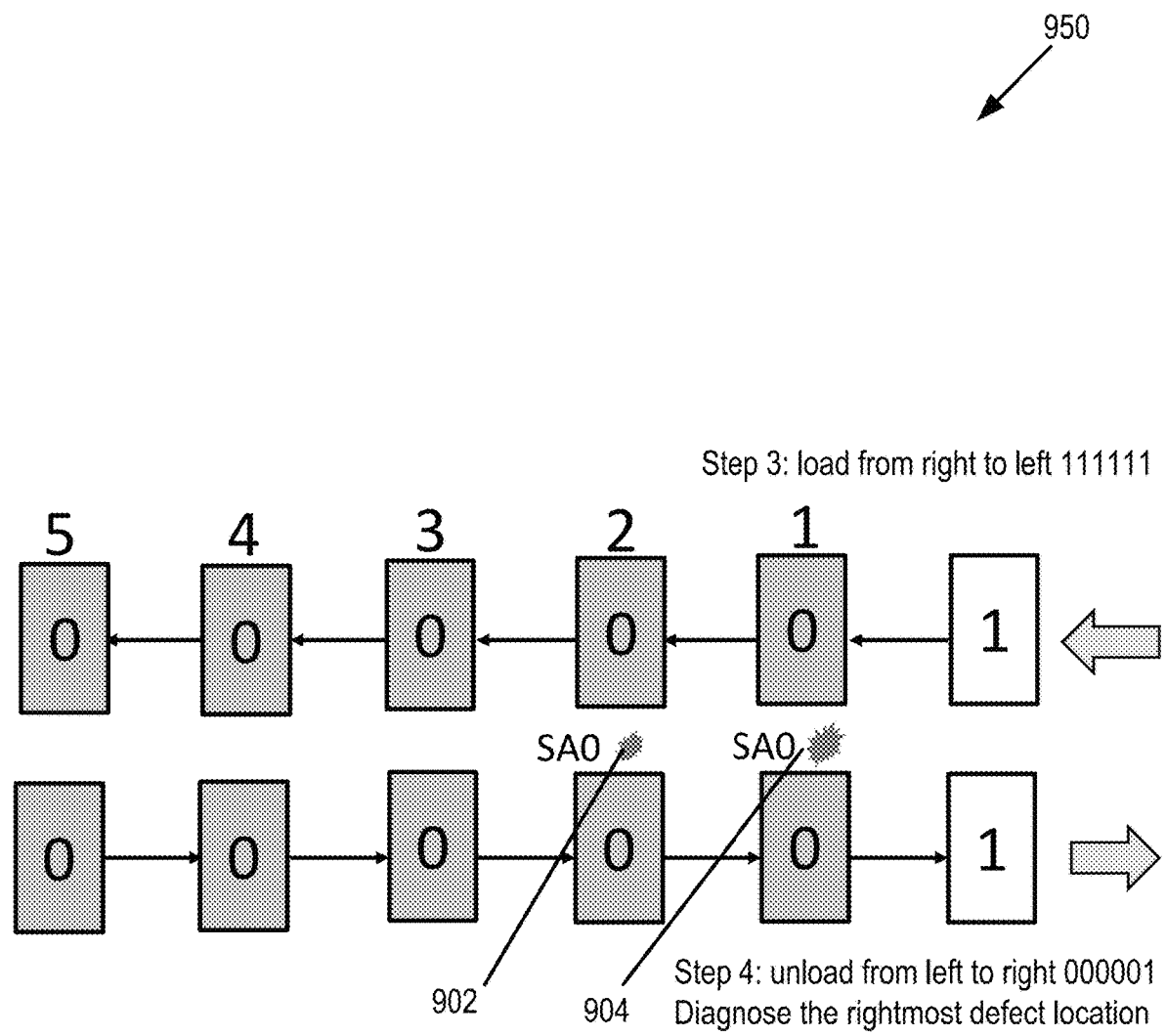

FIGS. 9A-B illustrate example block diagrams 900, 950 of testing using a static length pattern with a 4-step flow in which patters are loaded in different directions. Specifically, in FIG. 9A, step 1 includes loading from left to right 111111, step 2 includes unloading from right to left 111000 (due to a stuck at 0 (SA0 902) error in cell 2) as the scan chain test data. In FIG. 9B, step 3 includes loading from right to left 111111, step 4 includes unloading from right to left 000001 (due to a stuck at 0 (SA0 904) error in cell 1) as the scan chain test data. In this way, the system may analyze the results from the 4 steps by sending in scan chain patterns from one direction and then from another direction in order to diagnose at least two errors, such as the SA0 904 error in cell 1 and the SA0 902 error in cell 2.

Figure 4:
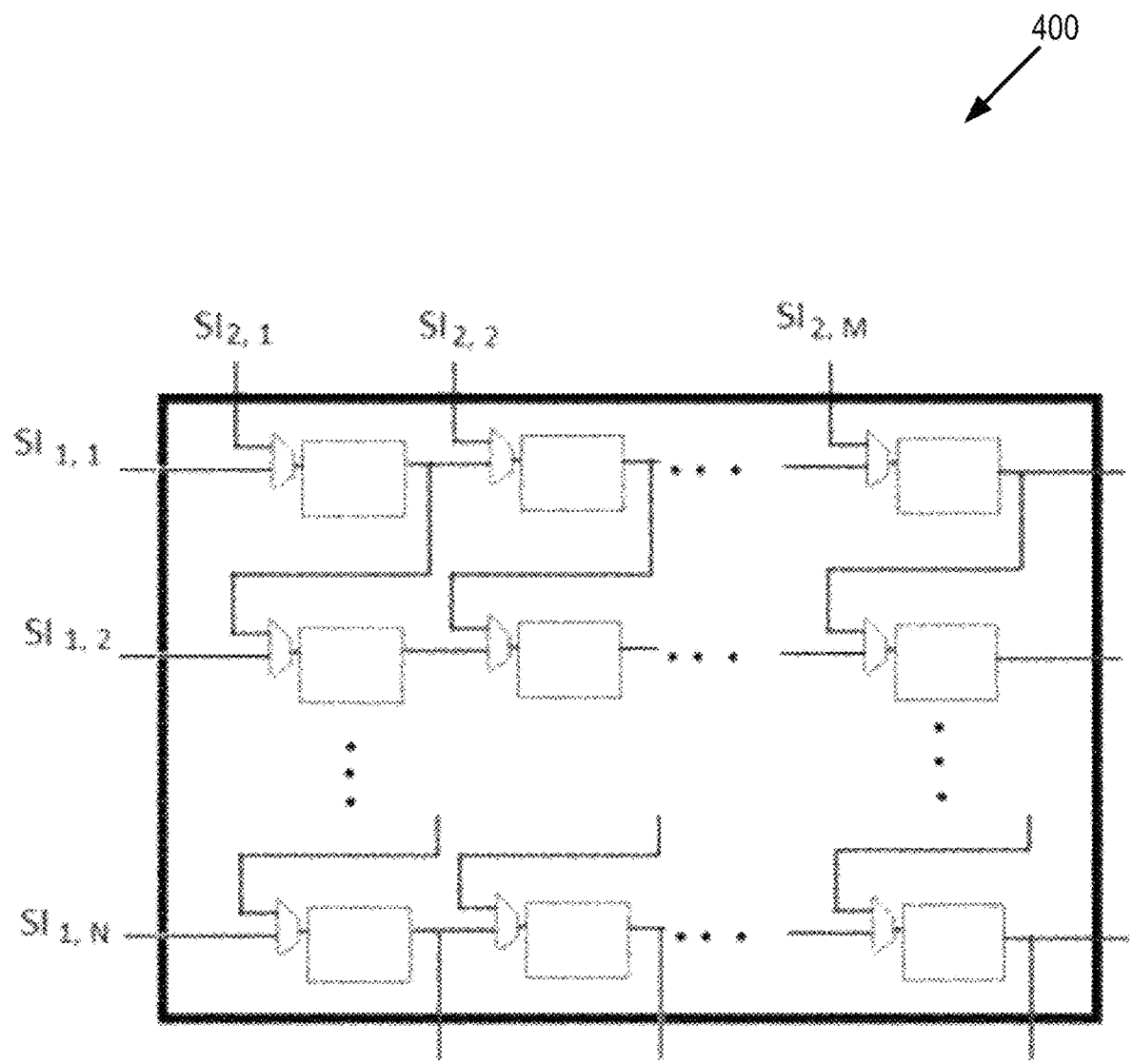
FIG. 4 illustrates an example block diagram of a two-dimensional scan cell network constructed using 2-to-1 multiplexers.

FIG. 4 illustrates an example block diagram 400 of a two-dimensional scan cell network constructed using 2-to-1 multiplexers. The two-dimensional scan cell network may work as a set of parallel one-dimensional scan chains (accepting signals from primary inputs $Sl_{1,1}$, $Sl_{1,2}$, . . . $Sl_{1,N}$, and shifting from left to right) when the selectors for the multiplexers are all set to be "0." Another set of parallel one-dimensional scan chains (accepting signals from primary inputs $Sl_{2,1}$, $Sl_{2,2}$, . . . $Sl_{2,N}$, and shifting from top to bottom) can be formed by setting the selectors to be "1." The scan paths for these two configurations of scan chains are perpendicular to each other, referred to hereinafter as parallel and perpendicular scan paths, respectively. If some of the selectors are set to be "0" while the others are set to be "1," more complex scan chains and thus scan paths may be constructed. If the number of I/O pins of a test circuit is small, the scan input pins at left side $SI_{1,1}$, $Sl_{1,2}$, . . . $Sl_{1,N}$ in FIG. 4 may share with the scan input pins at the top $Sl_{2,1}$, $Sl_{2,2}$, . . . $Sl_{2,N}$ because within each shift cycle, only one shift direction is used. The scan-input pin sharing may be controlled by the selectors for the corresponding multiplexers. Similar arrangement may be made for the scan-output pins.

Figure 5A:
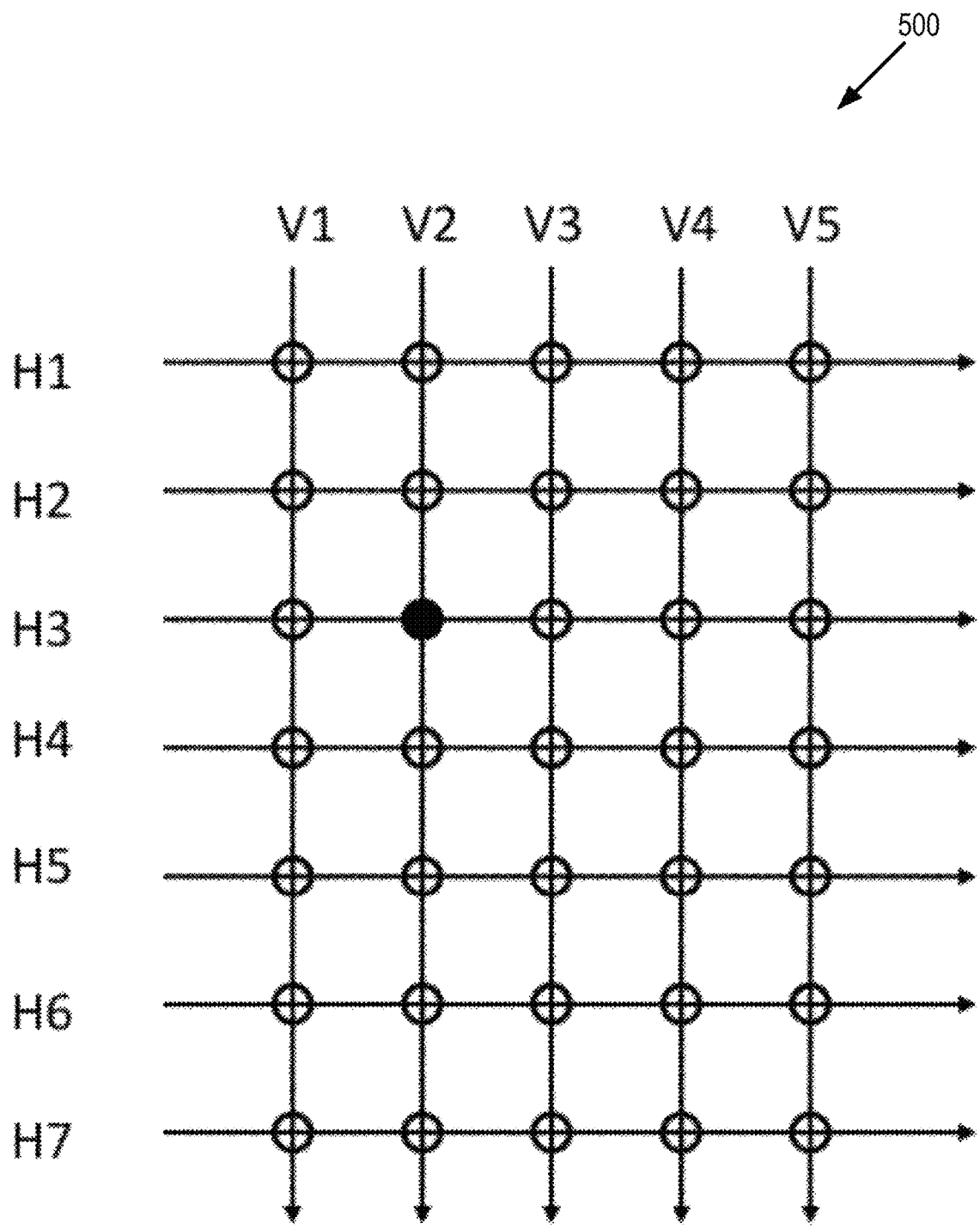
FIG. 5A illustrates an example block diagram of scan chain diagnosis involving one defective scan cell in a two-dimensional scan cell network.

FIG. 5A illustrates an example block diagram 500 of scan chain diagnosis involving one defective scan cell in a two-dimensional scan cell network. Scan cells may be designated by their coordinates corresponding to horizontal and vertical scan chains (scan paths). In the figure, the scan cell (H3, V2), at the intersection of scan chain H3 and V2, is the defective scan cell. Chain pattern tests along horizontal and vertical scan paths may identify H3 and V2 as faulty scan chains. The defective scan cell (H3, V2) may be readily determined based on the two identified faulty scan chains.

Figure 5B:
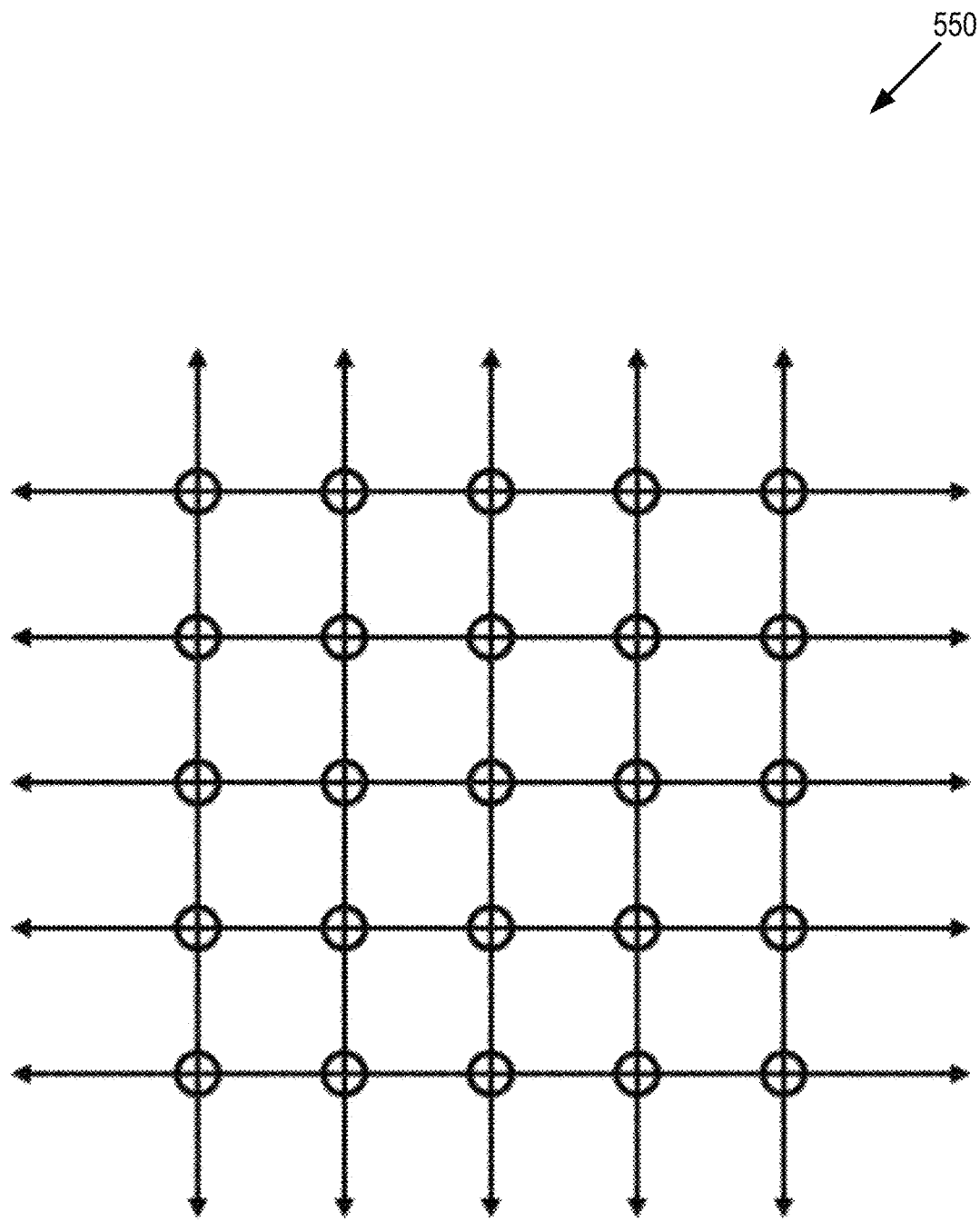
FIG. 5B illustrates an example block diagram of a two-dimensional scan cell network constructed by using 4-to-1 multiplexers.

FIG. 5B illustrates an example block diagram 550 of a two-dimensional scan cell network constructed by using 4-to-1 multiplexers. The input for each of the scan cells in the middle part is coupled to outputs of four surrounding scan cells through a 4-to-1 multiplexer. In this way, the scan cell network facilitates designing various sets of scan paths.

Figure 10:
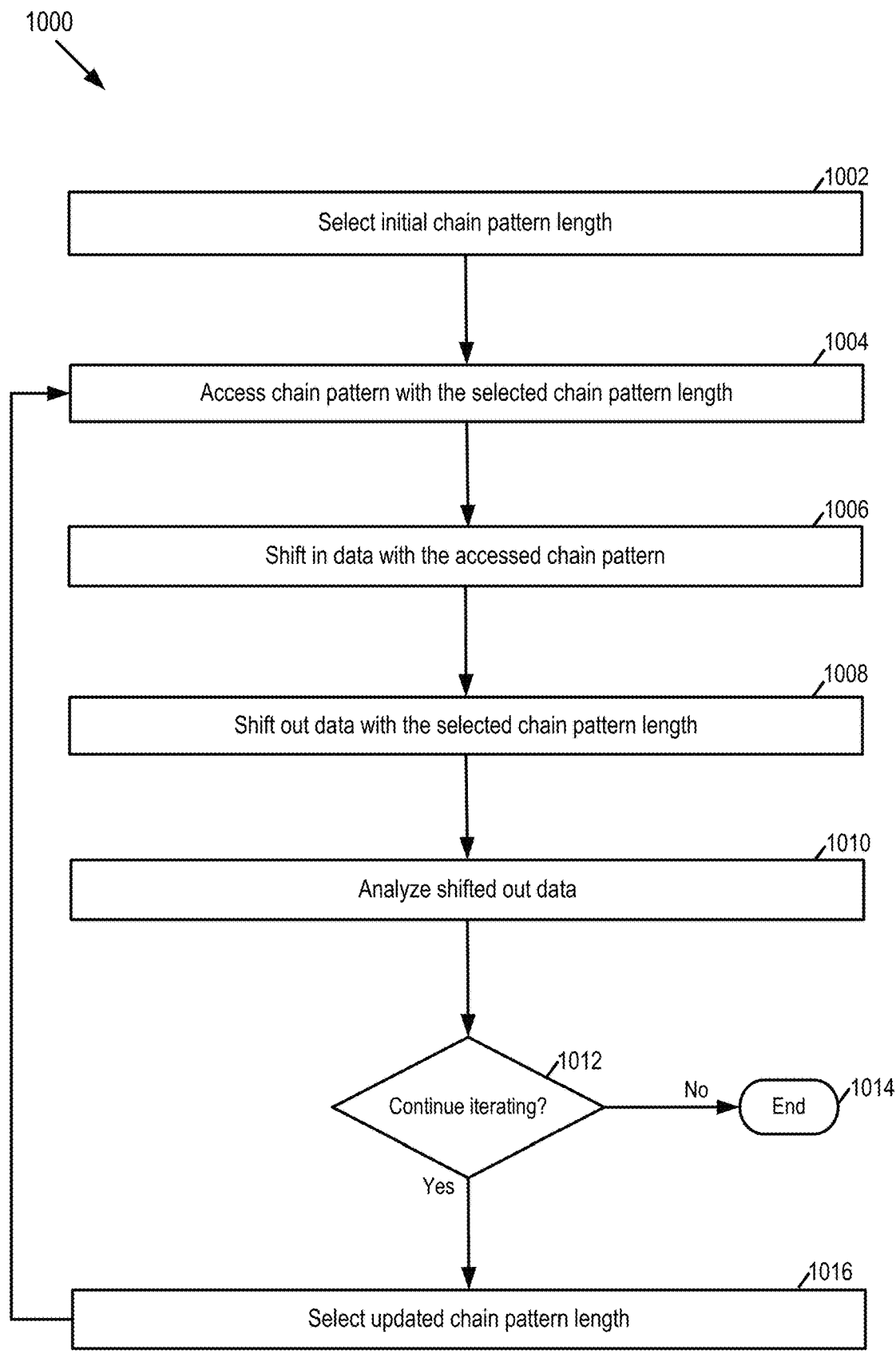
FIG. 10 illustrates a flow chart for testing using chain patterns with adaptive length.

As illustrated above, the chain patterns include a static shift length, which may be applied to volume testing. Alternatively, the system may use chain patterns with adaptive length. In this context, adaptive testing may be improved or optimized to use chain patterns with adaptive chain lengths. FIG. 10 illustrates a flow chart 1000 for testing using chain patterns with adaptive length. At 1002, the initial chain pattern length is selected. As one example, the initial chain pattern length selected may be predetermined.

Figure 11A:
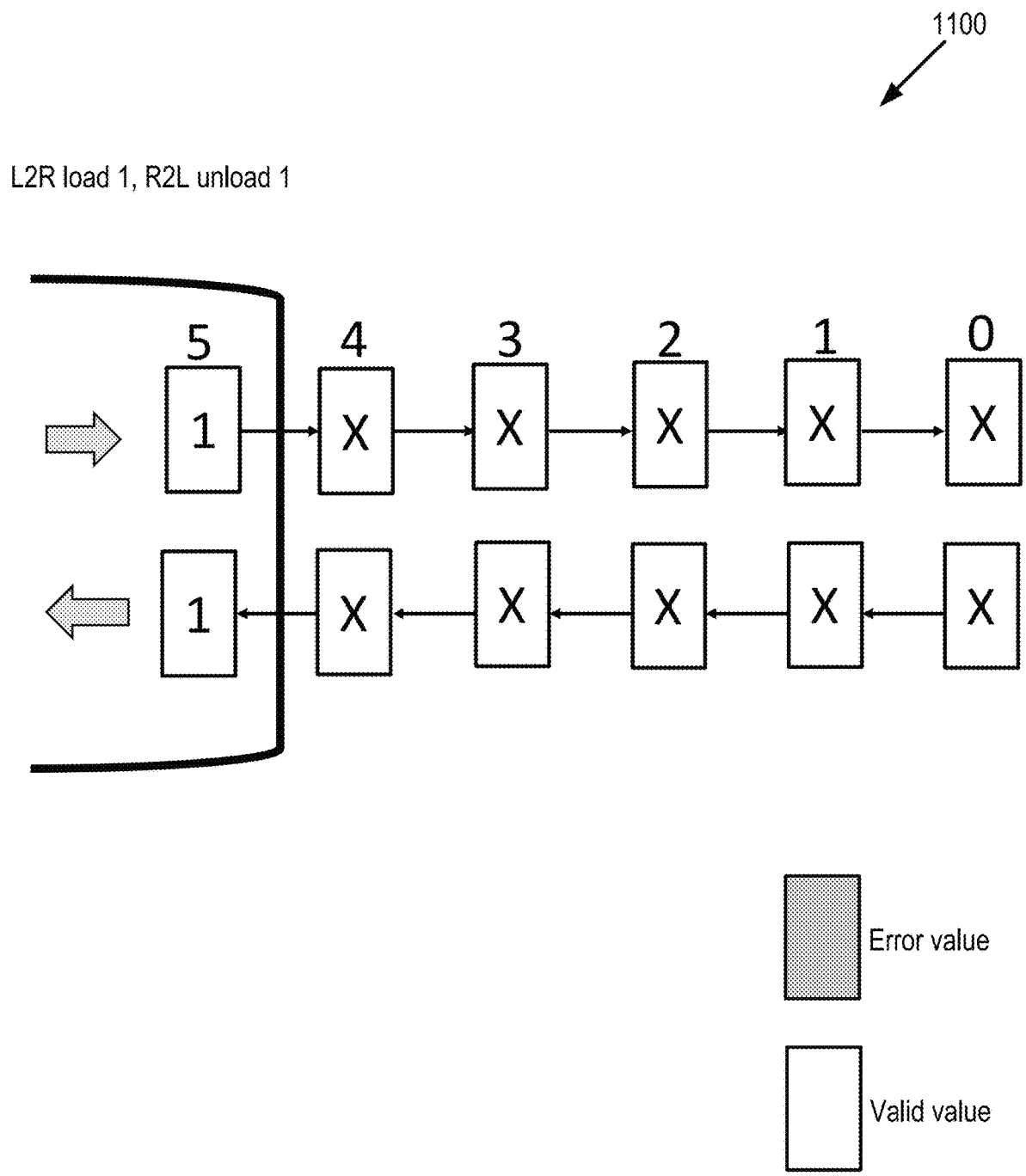
FIGS. 11A-C illustrate example block diagrams of using chain patterns with variable lengths.

At 1004, the scan chain pattern with the selected chain pattern length is accessed. For example, in a 100 cell scan chain, there may be multiple patterns, such as 100 L2R/R2L scan chain patterns (e.g., 1 shift L2R/1 shift R2L; 2 shift L2R/2 shift R2L; . . . 100 shift L2R/100 shift R2L) and 100 R2L/L2R scan chain patterns (e.g., 1 shift R2L/1 shift L2R; 2 shift R2L/2 shift L2R; . . . 100 shift R2L/100 shift L2R). Various initial chain pattern lengths may be selected. As one example, the initial chain pattern length may be 1, such as illustrated in FIG. 11A. Alternatively, the initial chain pattern length may be selected to be midway in the scan cell chain (e.g., in a 100 scan cell chain, the initial chain pattern length may be selected as 50). Responsive to selecting the initial chain pattern length (e.g., 50), the scan chain pattern with the selected initial chain pattern length may be accessed (e.g., 50 shift L2R/50 shift R2L). Alternatively, responsive to selecting the initial chain pattern length (e.g., 50), the scan chain pattern with the selected initial chain pattern length for both directions may be accessed (e.g., 50 shift L2R/50 shift R2L and 50 shift R2L/50 shift L2R).

At 1006, the data is shifted into the scan chain with the selected chain pattern length. At 1008, the data is shifted out from the scan chain with the selected chain pattern length to generate chain test data. After which, at 1010, the shifted out data (e.g., the scan chain test data) is analyzed. For example, the analysis may include determining whether there is an error in one or more cells in the scan chain.

At 1012, it is determined whether to continue iterating. If not, flow chart 1000 goes to end at 1014. If so, at 1016, an updated chain pattern length is selected. In one or some embodiments, the selection of the updated chain pattern length is based on whether an error has been detected.

As one example, for a scan chain of 100 cells, an initial predetermined sequence of chain pattern lengths may comprise the following: 1; 25; 50; 100. Alternatively, the initial predetermined sequence of chain pattern lengths may comprise the following: 50; 75; 100. If during the first iteration (with a chain pattern length set to 50), the analysis of the data shifted out (e.g., the first scan chain test data) indicates no errors, the chain pattern length for the second iteration may be set to 75, according to the sequence as dictated by the initial predetermined sequence of chain pattern lengths. If during the second iteration (with a chain pattern length set to 75), the analysis of the data (e.g., the second scan chain test data) indicates no errors, the chain pattern length for the third iteration may be set to 100, according to the initial predetermined sequence of chain pattern lengths. Alternatively, if during the second iteration (with a chain pattern length set to 75), the analysis of the data indicates one or more errors, the chain pattern length for the third iteration may deviate from the initial predetermined sequence of chain pattern lengths. For example, the analysis may indicate that the value at cell 70 is in error. Further analysis may be performed based on dynamically selected chain length sequences in order to determine one or both of the type of fault/defect or the location of the fault/defect (e.g., whether the fault/defect is within cell 70 or in the scan path to cell 70), as discussed in more detail below. Thus, responsive to identifying an error, the sequence may dynamically deviate from the initial predetermined sequence of chain pattern lengths. Further, the testing may comprise bidirectional testing (e.g., R2L/L2R; L2R/R2L) in order to identify bidirectional versus unidirectional faults.

Figure 11B:
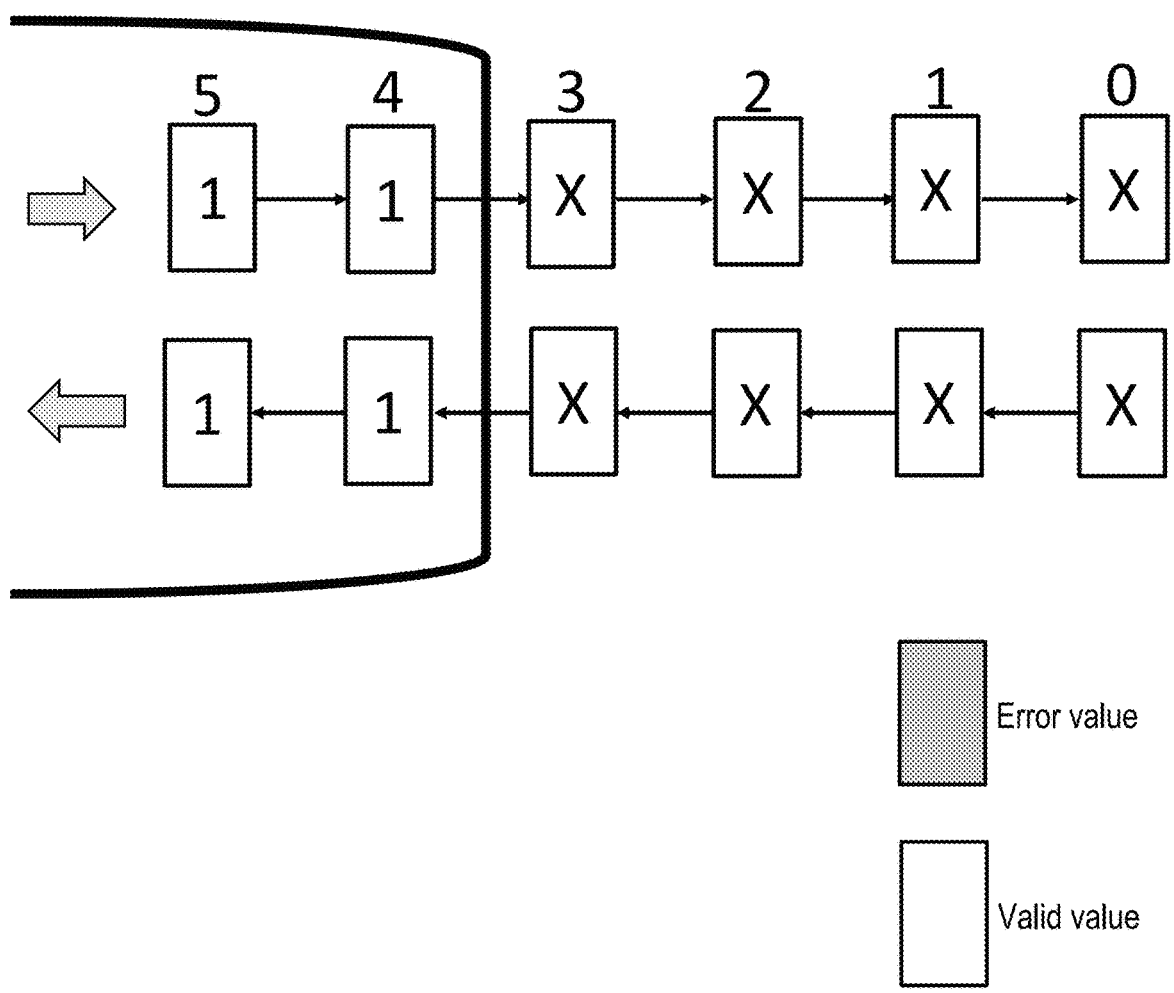
Figure 11C:
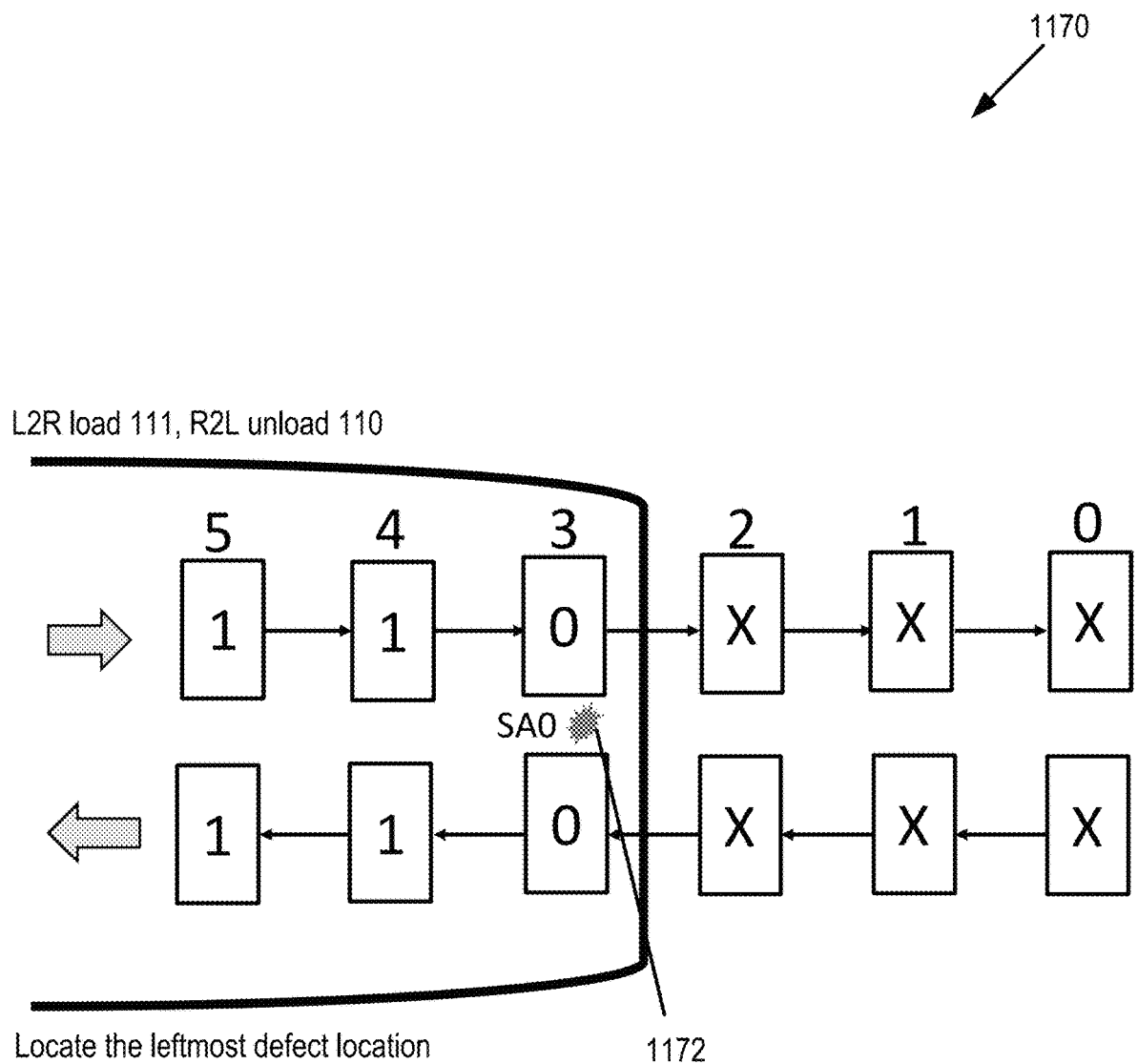

FIGS. 11A-C illustrate example block diagrams 1100, 1150, 1170 of using chain patterns with variable lengths. As shown in FIG. 11A, a chain pattern length of 1 is used in which L2R loads 1 and R2L unloads 1, indicating no error. As shown in FIG. 11B, a chain pattern length of 2 is used in which L2R loads 11 and R2L unloads 11, indicating no error. As shown in FIG. 11C, a chain pattern length of 3 is used in which L2R loads 111 and R2L unloads 110, indicating a stuck-at-0 (SA0 1172) error in cell 3.

Figure 12A:
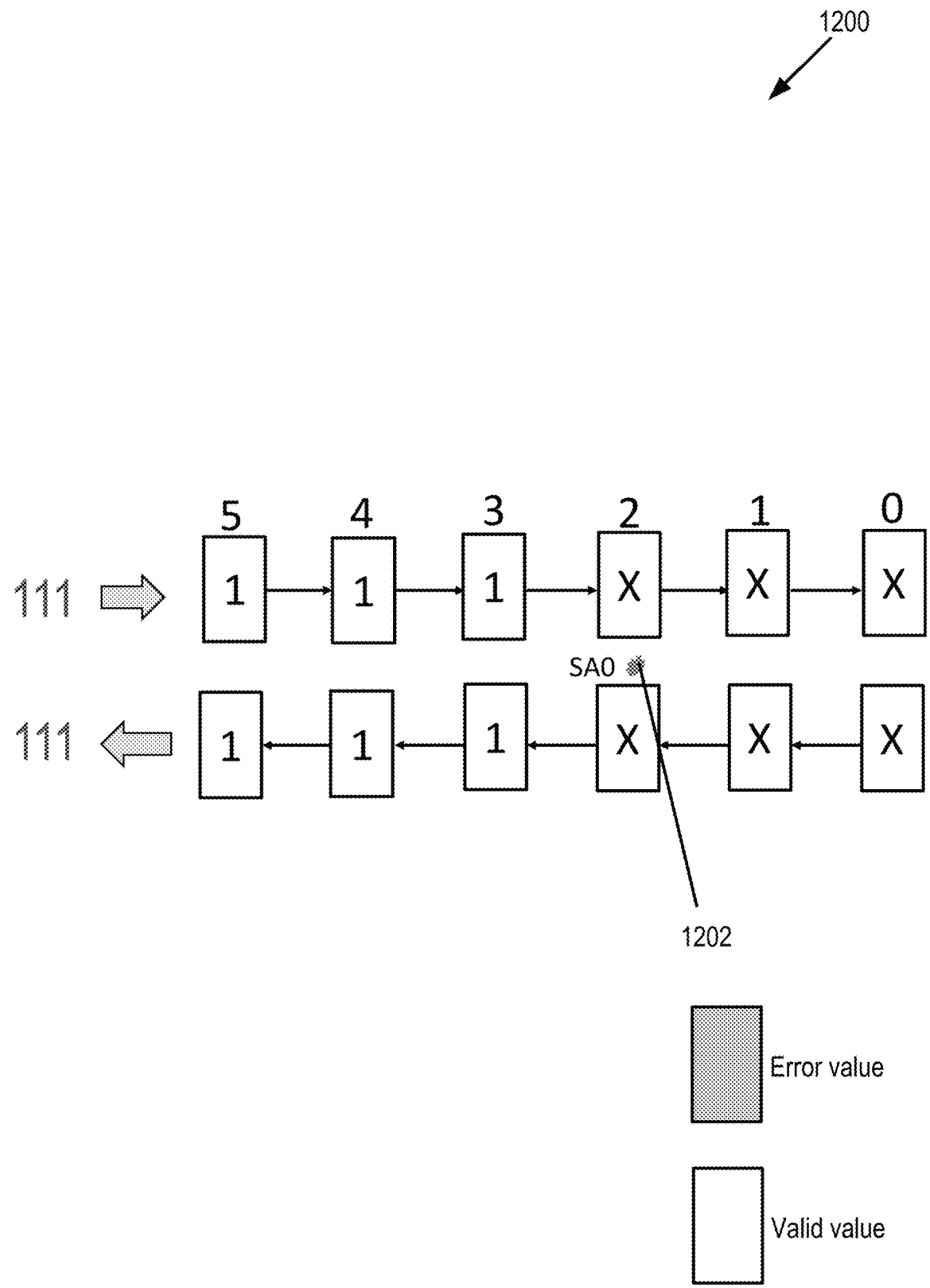
FIG. 12A illustrates an example block diagram of testing using a first adaptive length scan chain pattern ($LRL_{111}$).
Figure 12B:
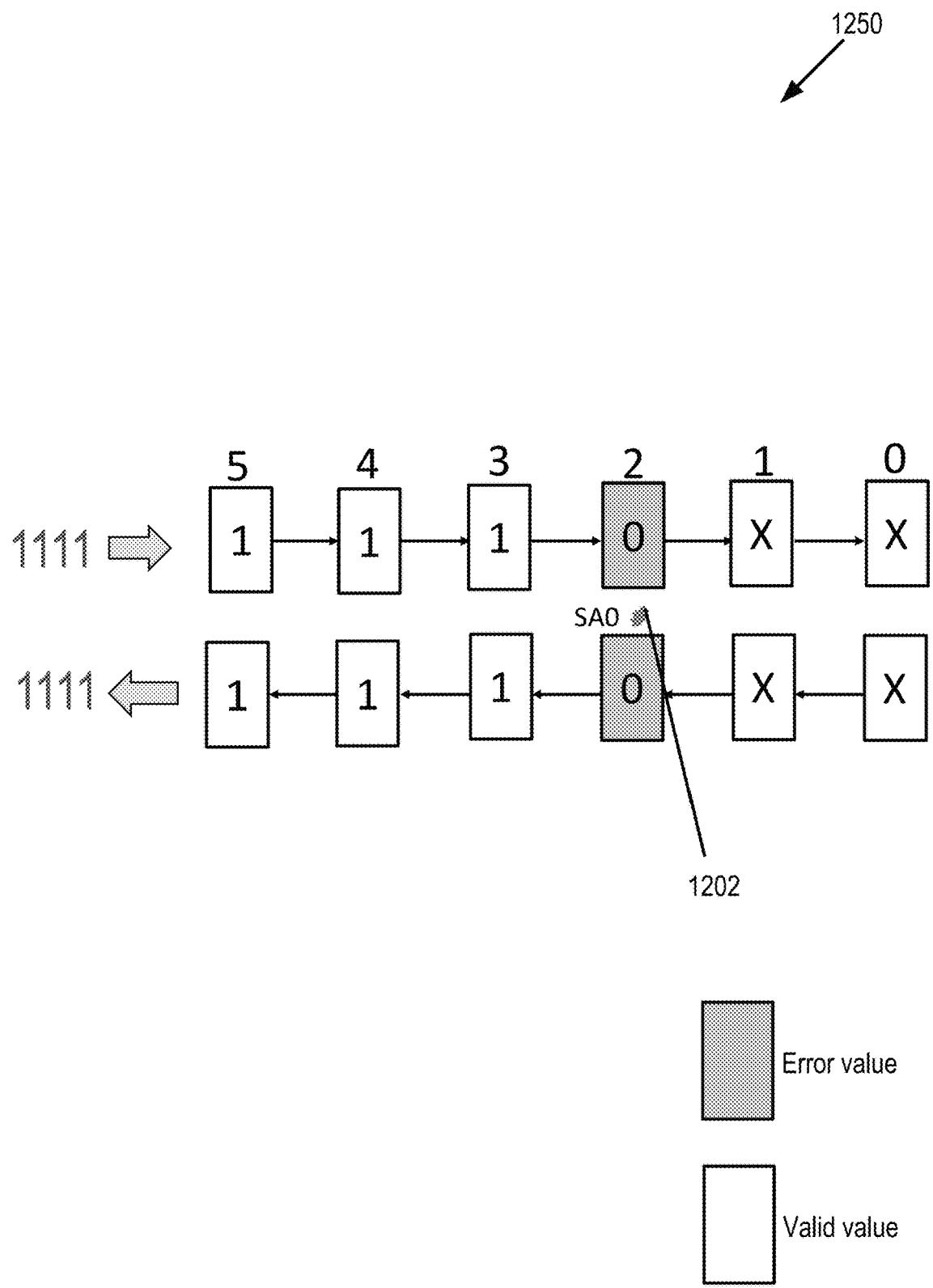
FIG. 12B illustrates an example block diagram of testing using a second adaptive length scan chain pattern ($LRL_{1111}$).

Another example block diagram 1200 is illustrated in FIG. 12A, whereby pattern 111 is first shifted in L2R with only half of the chain length, and then shifted out R2L. The system may analyze the shifted out data, determine that there are no failures, and determine that cells 3, 4 and 5 do not have stuck-at-0 fault. Thereafter, the system may modify the chain pattern length and do a binary search to locate the stuck-at-0 (SA0 1202) fault at cell 2, such as illustrated in the block diagram 1250 in FIG. 12B. As discussed above, the changes in the chain length may be adapted dynamically based on whether there are errors determined and/or in which cells the errors are determined.

Separate from identifying faults at the cells in the scan chain, faults, such as stuck-at faults, may be determined on the scan paths. In particular, if the defect is on the scan path that is shared by bidirectional shift paths, such as the output pin of the MUX controlled by DIR or the scan cell output before fanout to different paths, the diagnosis is the same as discussed above with regard to the cell internal fault diagnosis. However, if the defect is on the scan path that is only used by unidirectional shift (e.g., a unidirectional fault/error), such as one of the input pins of the MUX controlled by DIR, the diagnosis is different than described with regard to the cell internal fault diagnosis.

Figure 13:
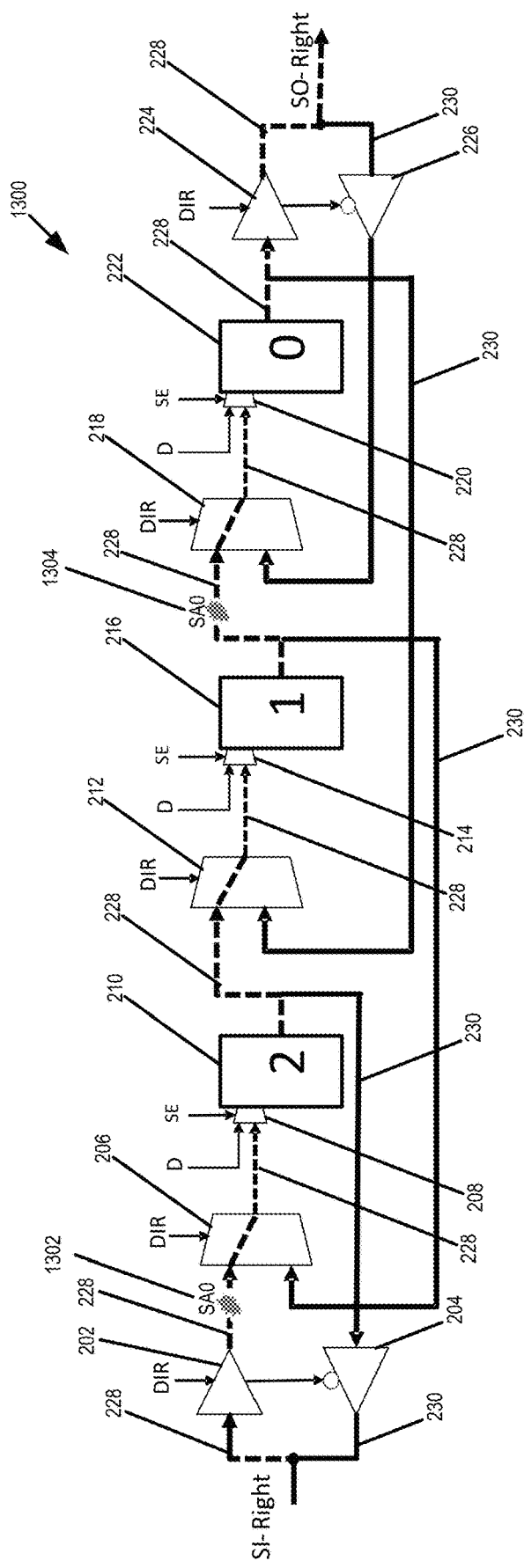
FIG. 13 illustrates an example block diagram of testing to identify two stuck-at-0 faults.

An example of the methodology is illustrated in FIG. 13, where using pattern $LRL_{1111}$ ... may diagnose the stuck-at-0 fault 1302 at cell 2 because the first failure is observed on Cell 2. FIG. 13 further illustrates a stuck-at-0 fault 1304 at cell 0. However, the system may consider whether the real defect is on the scan input path of Cell 2. In this regard, the scan input path may also be examined for the reported suspect scan cell. On the other hand, using pattern $RLR_{1111}$ ... enables a first load of all "1"s R2L without any errors. Then, this pattern is unloaded L2R. As shown in FIG. 13, the first observed failure is Cell 1. Thus, in one or some embodiments, the analysis may end there and Cell 1 is reported as having a stuck-at-0 fault (based on disclosure above). Alternatively, in order to determine whether the real defect is on the scan input of Cell 0, additional analysis may be performed. Practically speaking, it may not be known whether the defect is internal to a cell or external, such as on scan paths. Therefore to improve the diagnostic accuracy, when the analysis reports a suspect scan cell, the system may also analyze the scan paths before and after the suspect cell for potential faults.

Figure 14:
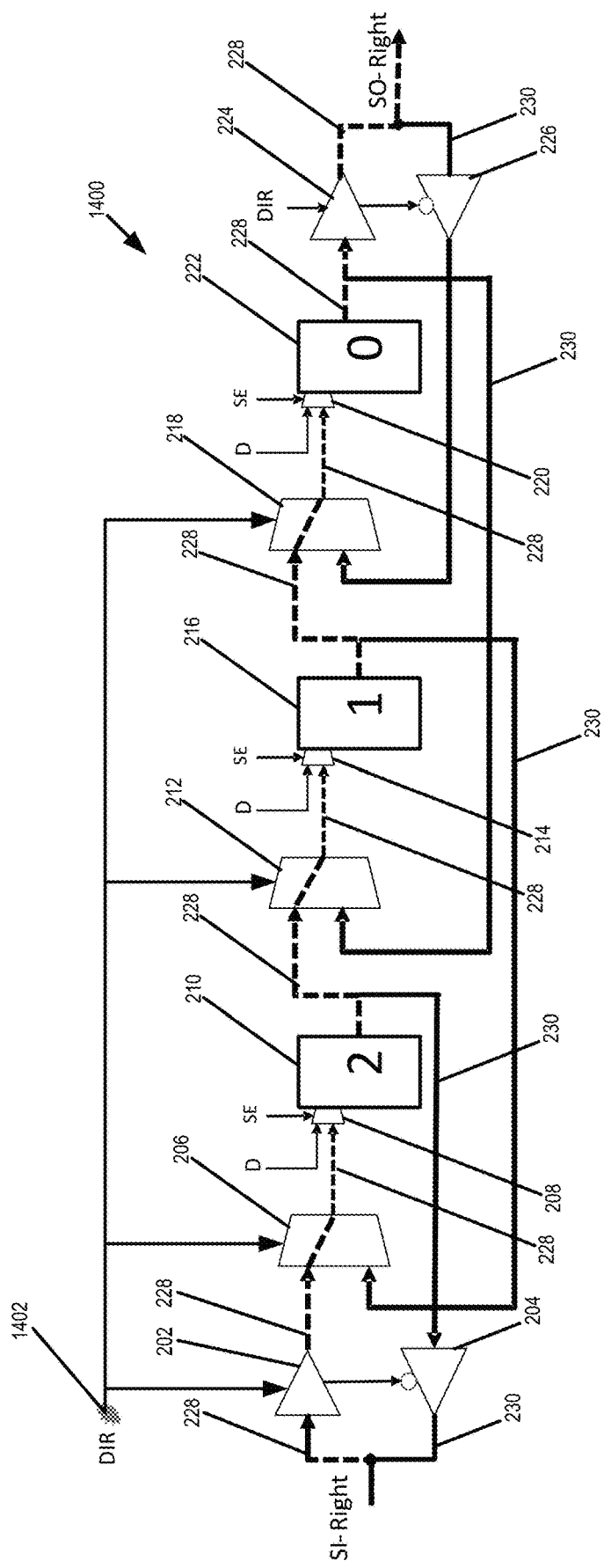
FIG. 14 illustrates an example block diagram of testing to identify stuck-at fault in DIR.

If the shift direction control pin DIR has a stuck-at fault (such as illustrated in the block diagram 1400 in FIG. 14), patterns shifting in one direction will pass, and patterns shifting in the other direction will fail in a specific manner. For example, if DIR is stuck-at-0 (1402), the L2R pattern will always pass. However, the R2L pattern will always be stuck-at some specific value. This is because for the R2L shift, the system measures a high impedance (Z) state in which the signal is not being driven. When the signal is left open, the signal voltage level may be determined by the pull-up resistor. To diagnose such defect, at least four patterns are used. For example, two regular chain patterns, such as $L2R_{0011}$ and $R2L_{0011}$, may be applied first. Such defect will cause one regular pattern to pass and the other to fail. Assuming the defect behavior is stuck-at-0, the system may then apply two U-turn patterns such as $LRL_{1111}$ ... and $RLR_{1111}$ .... Both U-turn patterns will fail as if two stuck-at-0 faults are at the both ends of this scan chain. Likewise, to test for defect behavior for stuck-at-1, the system may then apply two U-turn patterns such as $LRL_{0000}$ ... and $RLR_{0000}$ ... Both U-turn patterns will fail as if two stuck-at-1 faults are at the both ends of this scan chain.

As discussed above, various timing faults may be identified, such as due to delayed signal propagation or speedup signal propagation. In particular, the delayed signal propagation may cause a setup-time defect and the speedup signal propagation may cause hold-time defect. For purposes of example, the hold-time defect is examined. However, setup-time defects may also be diagnosed, though the setup-time defect has the opposite behavior as the hold-time defect.

Nevertheless, all the diagnostic patterns and methodologies disclosed for hold-time defects may be readily adapted to address setup-time defects.

Figure 15A:
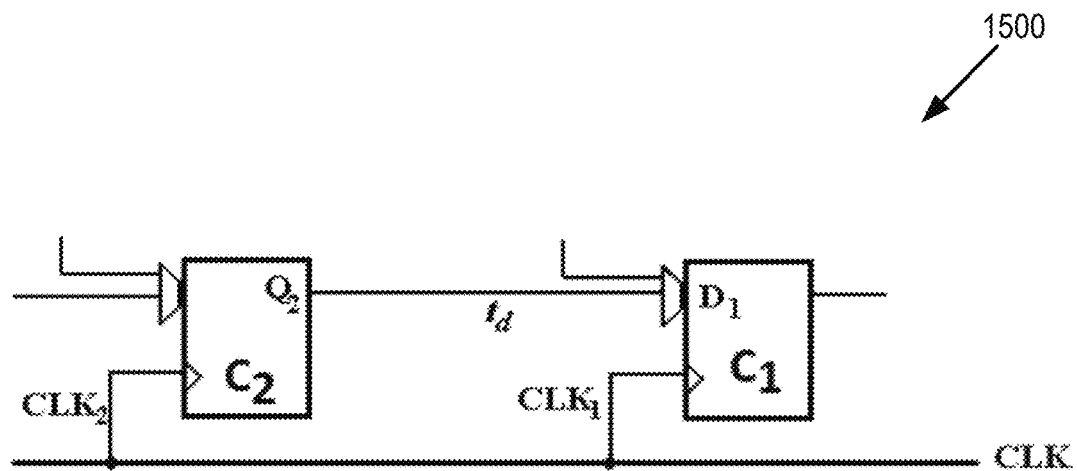
FIG. 15A illustrates a block diagram of a pair of scan cells.
Figure 15B:
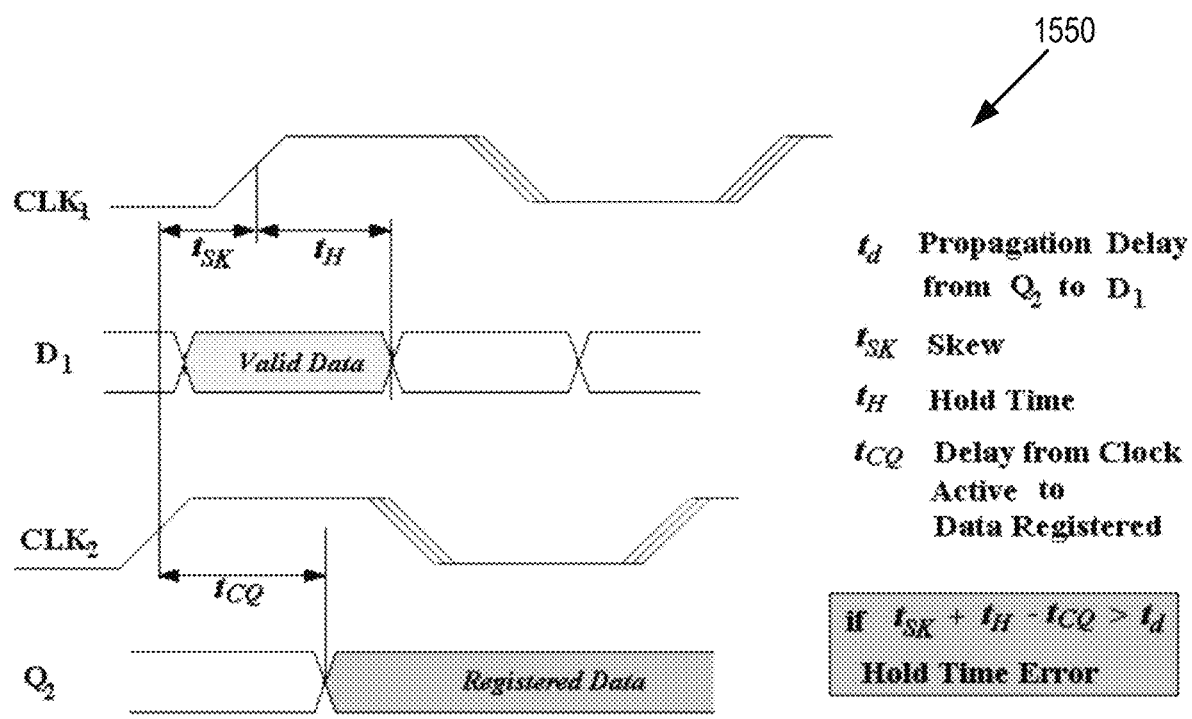
FIG. 15B illustrates timing diagrams for the pair of scan cells illustrated in FIG. 15A.

FIG. 15A illustrates a block diagram 1500 of a pair of scan cells $C_1$ and $C_2$. FIG. 15B illustrates timing diagrams 1550 for the pair of scan cells $C_1$ and $C_2$ illustrated in FIG. 15A. Based on the timing diagram shown in FIG. 15B, a hold-time defect may be triggered if $t_{SK}+t_H-t_{CQ}>td$, where $t_{SK}$ is the clock skew between $CLK_1$ and $CLK_2$, $t_H$ is the required hold time margin, $t_{CQ}$ is the delay from activating clock to registering data for the driving flip-flop ($C_2$) and $t_d$ is the propagation delay from the output of $C_2$ ($Q_2$) to the input of $C_1$ ($D_1$). Typically, there are two possible root causes for hold-time defects: (A) scan path delay ($t_d$) is too small; or (B) clock skew ($t_{SK}$) is too large.

For cause (A), it may be classified into two scenarios including: (A.1) the defect is on the scan path that is shared by bidirectional shift paths; and (A.2) the defect is on the scan path that is only used by unidirectional shift path. First considering (A.1), for such defects, the previous proposed U-turn patterns may not work, as explained in more detail below.

Figure 16:
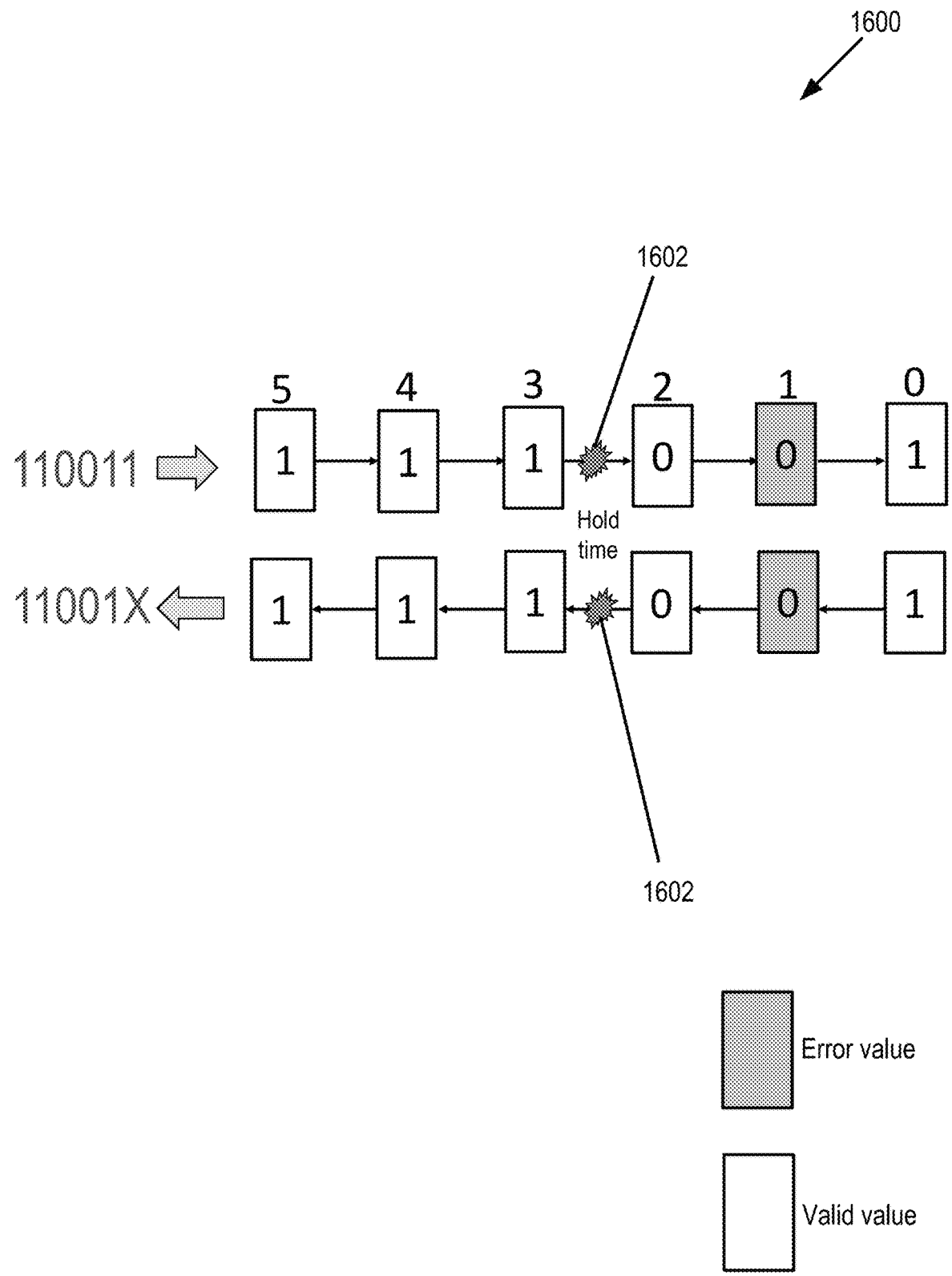
FIG. 16 illustrates a block diagram of testing using U-turn scan chain pattern attempting to identify a scan path delay as being too small, with the scan path being shared by bidirectional shift paths.

FIG. 16 illustrates an example block diagram 1600 in which the system attempts to use $LRL_{110011}$ pattern to diagnose timing faults, such as the hold-time defect or the setup time defect. More specifically, assuming the hold-time defect 1602 is caused due to fast-than-expected scan path between Cell 2 and Cell 3, the loaded pattern will have an error when a "0" to "1" or a "1" to "0" transition in the pattern passing through the defect site. Hence, in the example illustrated in FIG. 16, the loaded pattern has a faulty value at cell 1. Nevertheless, this faulty value is reverted back when shifted R2L. The last bit is "X" because it depends on the value holding at the right end scan chain input (e.g., X is determined by the value at the last cycle held at scan-in). If there is a transition between this value and the value at Cell 0, it will fail when passing through the hold-time error site; otherwise it will pass.

In theory, any U-turn patterns may be unable to diagnose a hold time defect of type (A.1). In particular, a U-turn pattern may identify that there is an error, and a non-U-turn pattern (such as a Z-pattern) may identify the type of error. Thus, in one or more embodiments, a non-U-turn pattern may be used in order to diagnose a hold time defect. In one or some embodiments, the non-U-turn is used in combination with the U-turn pattern to diagnose the hold defect (e.g., the U-turn pattern may be used first to identify the error, and the non-U-turn pattern may be used to identify the location and/or type of fault). Alternatively, the non-U-turn pattern(s) may be used alone.

As one example, the non-U-turn pattern may comprise at least a three-turn pattern (e.g., a three-turn pattern, a four-turn pattern, a five-turn pattern, etc.), including at least a first turn, a second turn, and a third turn, and may be used to diagnose timing faults. As one example, the three-turn pattern may comprise a Z-turn pattern, which may be used to diagnose such defects. In one example, the Z-turn pattern first shifts N cycles L2R, where N is the scan chain length (or less than the scan chain length), then make a U-turn to shift M cycles R2L (where M<N), and then make another U-turn to shift N cycles L2R to unload. Such patterns may be denoted as $LRLR_{0011\leftarrow1}$ if M=1 (as indicated by 1 digit after "←") and shifting in a "1" (as indicated by "1" after "←") R2L between loading and unloading, as illustrated in the block diagram 1700 in FIG. 17A. In particular, LRLR may represent three turns, including a first turn L2R (represented by the first two letters "LR"), the second turn R2L (represented by the $2^{nd}$ and $3^{rd}$ letters "RL"), and the third turn (represented by the $3^{rd}$ and $4^{th}$ letters "LR"). Another Z-turn pattern $LRLR_{0011\leftarrow11}$ is illustrated in FIG. 17B, where. M=2 and shifting in "11" R2L between loading and unloading. In another example, the Z-turn pattern first shifts N cycles R2L, then make a U-turn to shift M cycles L2R, and then make another U-turn to shift N cycles R2L to unload.

Figure 17A:
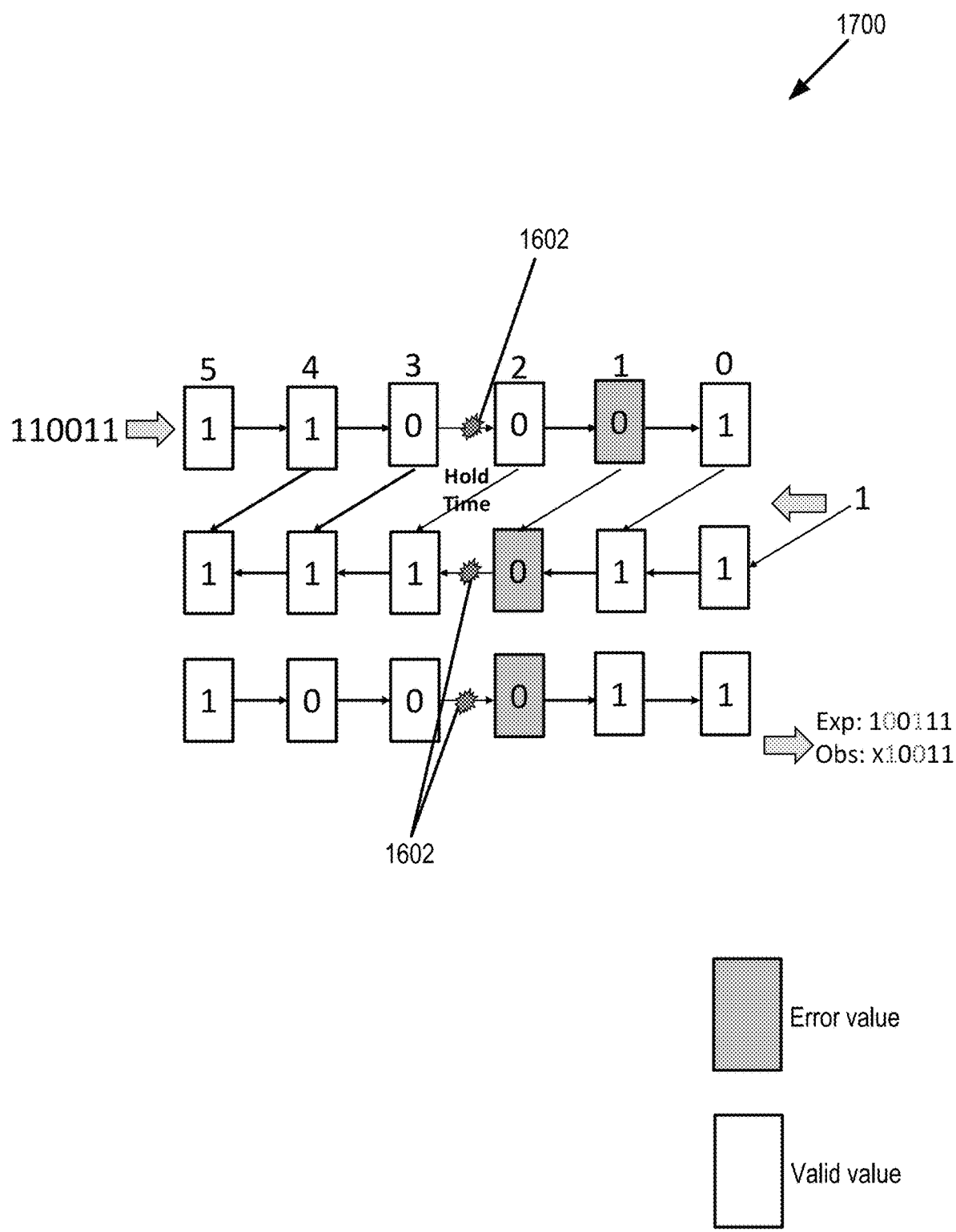
FIG. 17A illustrates a block diagram of testing using a first Z-turn scan chain pattern ($LRLR_{0011 \leftarrow 11}$) used to identify a scan path delay as being too small, with the scan path being shared by bidirectional shift paths.
Figure 17B:
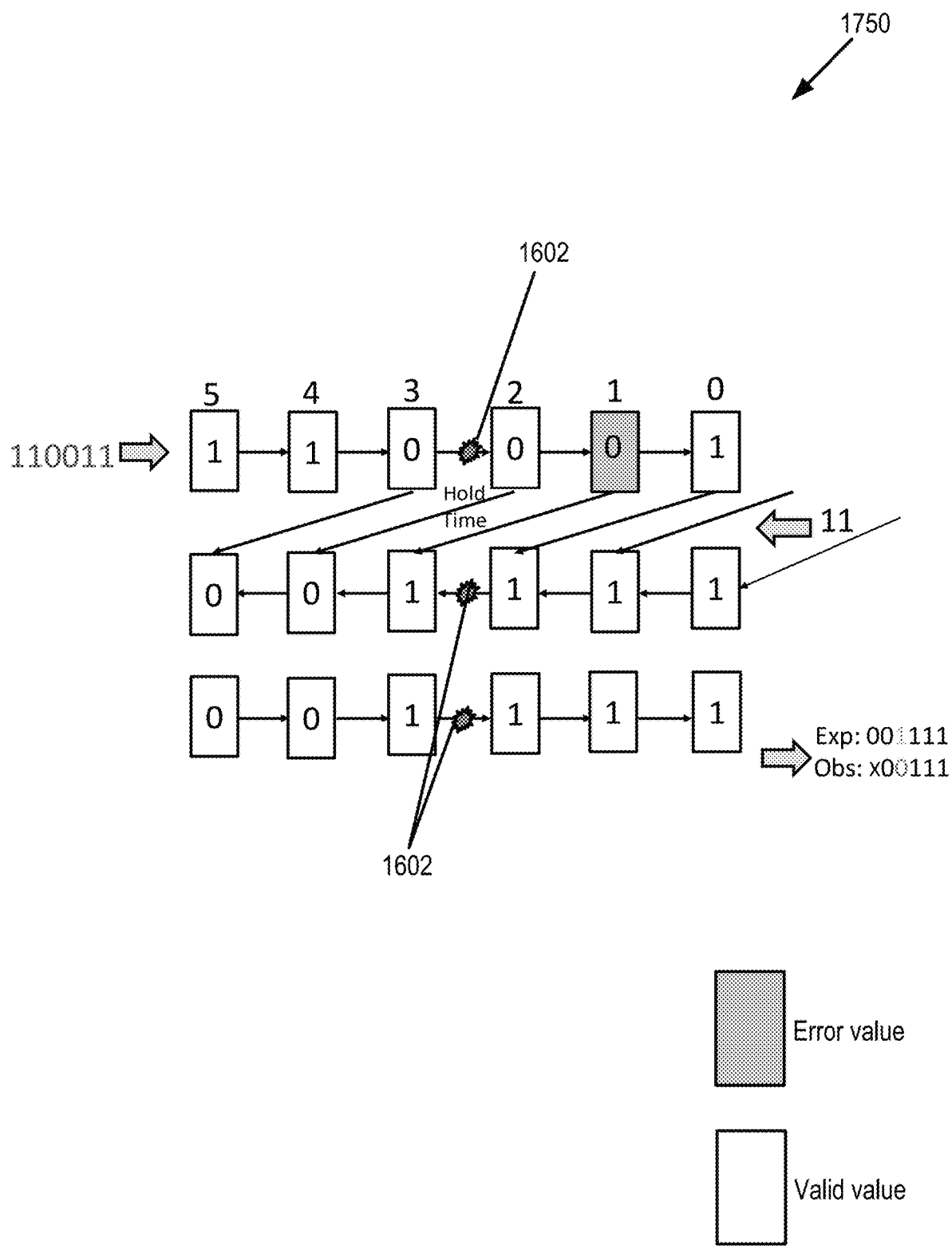
FIG. 17B illustrates a block diagram of testing using a first Z-turn scan chain pattern ($LRLR_{0011 \leftarrow 11}$) used to identify a scan path delay as being too small, with the scan path being shared by bidirectional shift paths.

With pattern $LRLR_{0011\leftarrow1}$ illustrated in FIG. 17A, the loading error on cell 1 is not corrected during the middle R2L shift because the transition does not pass through the hold-time defect location. This ends up with two failing bits at Cell 4 and Cell 2, as indicated in the red bits in the "Obs" bitstream. It indicates that the defect location is in the upstream of Cell 2. On the other hand, with pattern $LRLR_{0011\leftarrow11}$ illustrated in the block diagram 1750 in FIG. 17B, the loading error on cell 1 is corrected during the middle R2L shift because the transition passed through the hold-time defect location. This ends up with only one failing bit at Cell 3, as indicated in the red bits in the "Obs" bitstream. It indicates that the defect location is in the downstream of Cell 3. Therefore, by using the above two patterns, the system may narrow down the defect location is between Cell 2 and Cell 3.

As discussed above, the scan chain testing may be performed to identify different types of faults such as any one, any combination, or all of: stuck at 1 faults; stuck at 0 faults; transition faults (e.g., transitioning from 0 to 1 or from 1 to 0); hold-time faults; etc. This testing may be performed using different scan chain patterns, such as all 1s, all 0s, alternating 0s and is (e.g., 00110011 . . . ), in order to identify the different faults. For example, a respective U-turn scan chain pattern may identify that there is an error in the value of a respective cell. The identified error in the value of the respective cell may be caused by different underlying defects including one or both of: a defect in the respective cell at which the error value was identified; or a defect in the path to the respective cell. In that regard, additional scan chain patterns, such as additional U-turn scan chain patterns and/or Z-turn scan chain patterns, may be tested in order to determine one or both of the type of defect and the location of the defect. In particular, additional scan chain patterns may be tested in order to determine the type of defect (e.g., unidirectional or bidirectional; stuck-at fault (e.g., stuck at 0 or stuck at 1); hold-time fault; DIR fault; etc.) and/or where the defect is located (e.g., whether the defect is within a particular scan chain cell or is located outside of the particular scan chain cell, such as between particular scan chain cells).

Unidirectional errors may be identified by testing using scan chain patterns in both directions. As one example, a first set of U-turn patterns (e.g., L2R/R2L) may be tested to identify errors. Thereafter, a second set of U-turn patterns (e.g., R2L/L2R) in the opposite direction to the first set of U-turn patterns may be tested to identify errors. If error values are identified in the same cell in both sets of U-turn patterns (e.g., using a L2R/R2L and R2L/L2R), the defect is identified as bidirectional. Conversely, if error values are identified in the same cell only in one of the sets of U-turn patterns (e.g., only in L2R/R2L but not in R2L/L2R; only in R2L/L2R but not in L2R/RL2), the defect is identified as unidirectional.

Further, various sequences of scan chain patterns are contemplated. As one example, U-turn patterns followed by subsequent tailored U-turn patterns may be tested, such as discussed below with regard to FIG. 18C. For example, one or more U-turn patterns may be used in order to determine whether the fault is a stuck-at fault or a hold time error (or other transition-type error). Thereafter, one or more Z-turn patterns may be used. For example, responsive to determining that a hold time fault is present, one or more Z-turn patterns may be used to identify where the hold time fault resides. In particular, U-turn patterns may identify an error value associated with a particular scan chain cell. Thereafter, Z-turn patterns may identify the type of defect and/or the location of the defect, such as discussed below with regard to FIG. 18D.

Figure 18A:
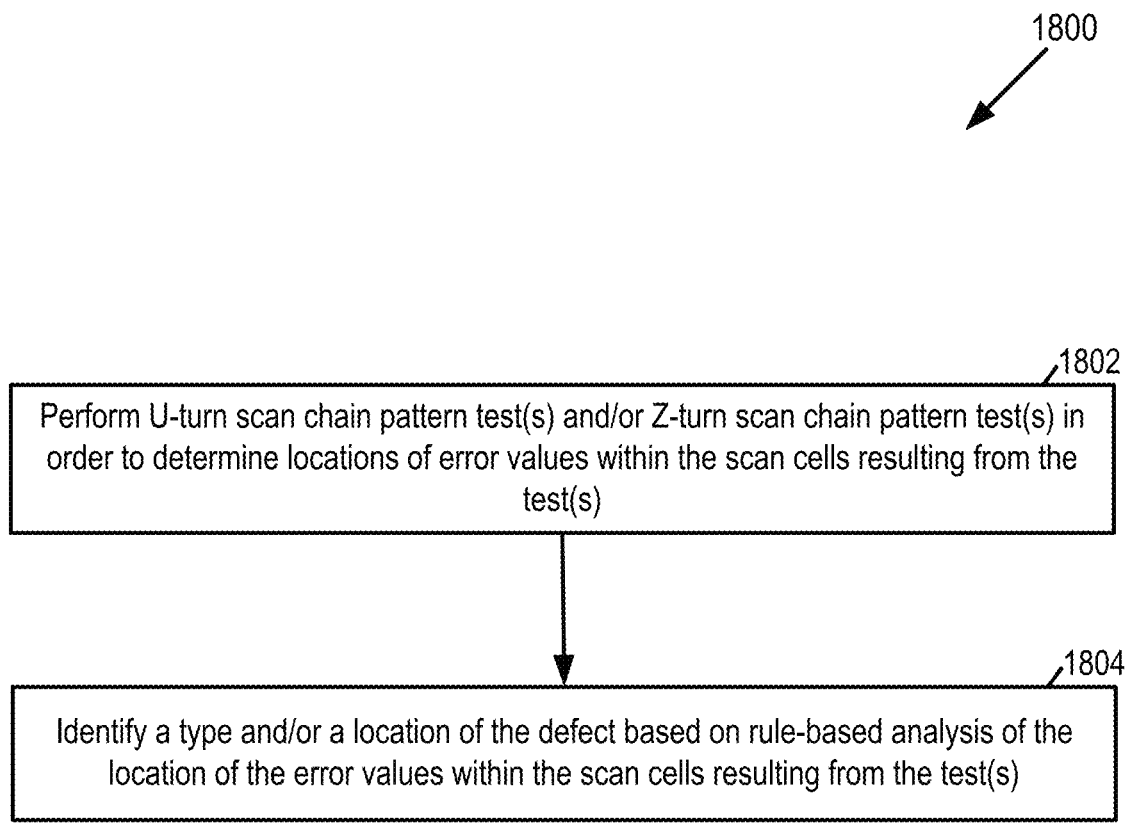
FIG. 18A illustrates a flow chart for testing U-turn scan chain patterns and/or Z-turn scan chain patterns in order to a location and/or a type of defect.
Figure 19A:
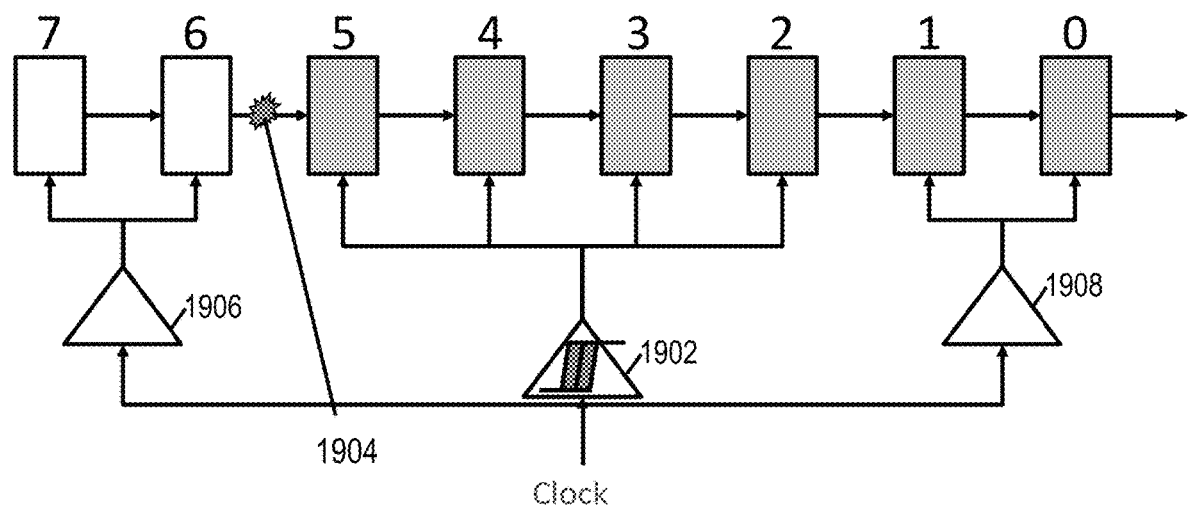
FIGS. 19A-C illustrate block diagrams of testing used to identify delayed clock error (e.g., a clock skew as being too large such as one slow clock drives consecutive scan cells).
Figure 19A:
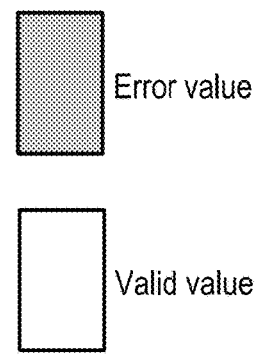
Figure 19B:
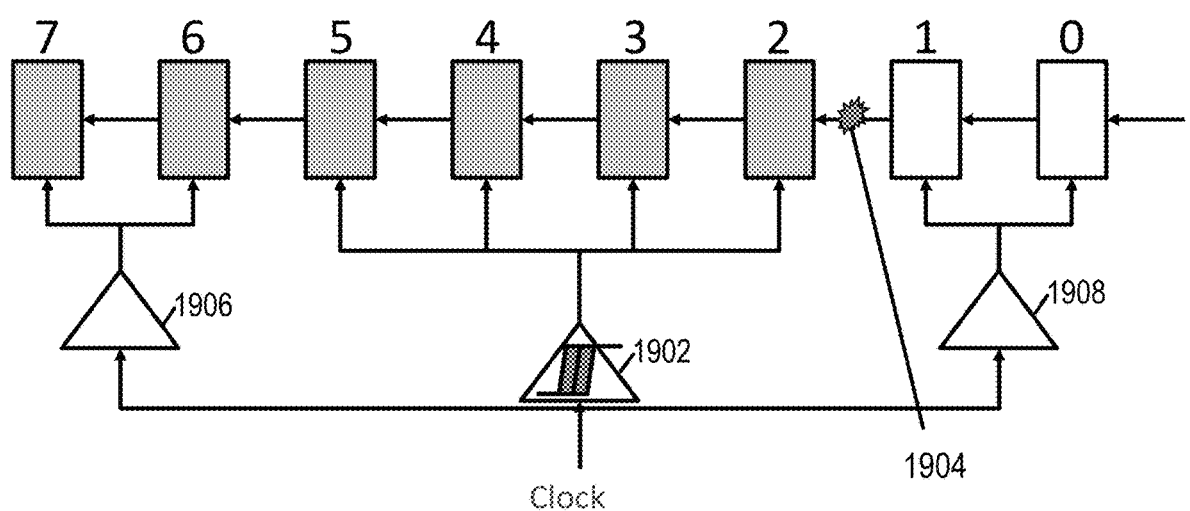
Figure 19B:
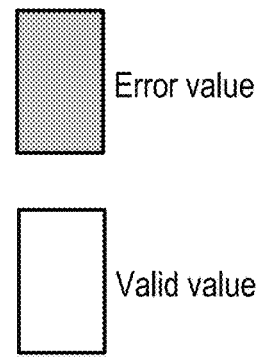
Figure 19C:
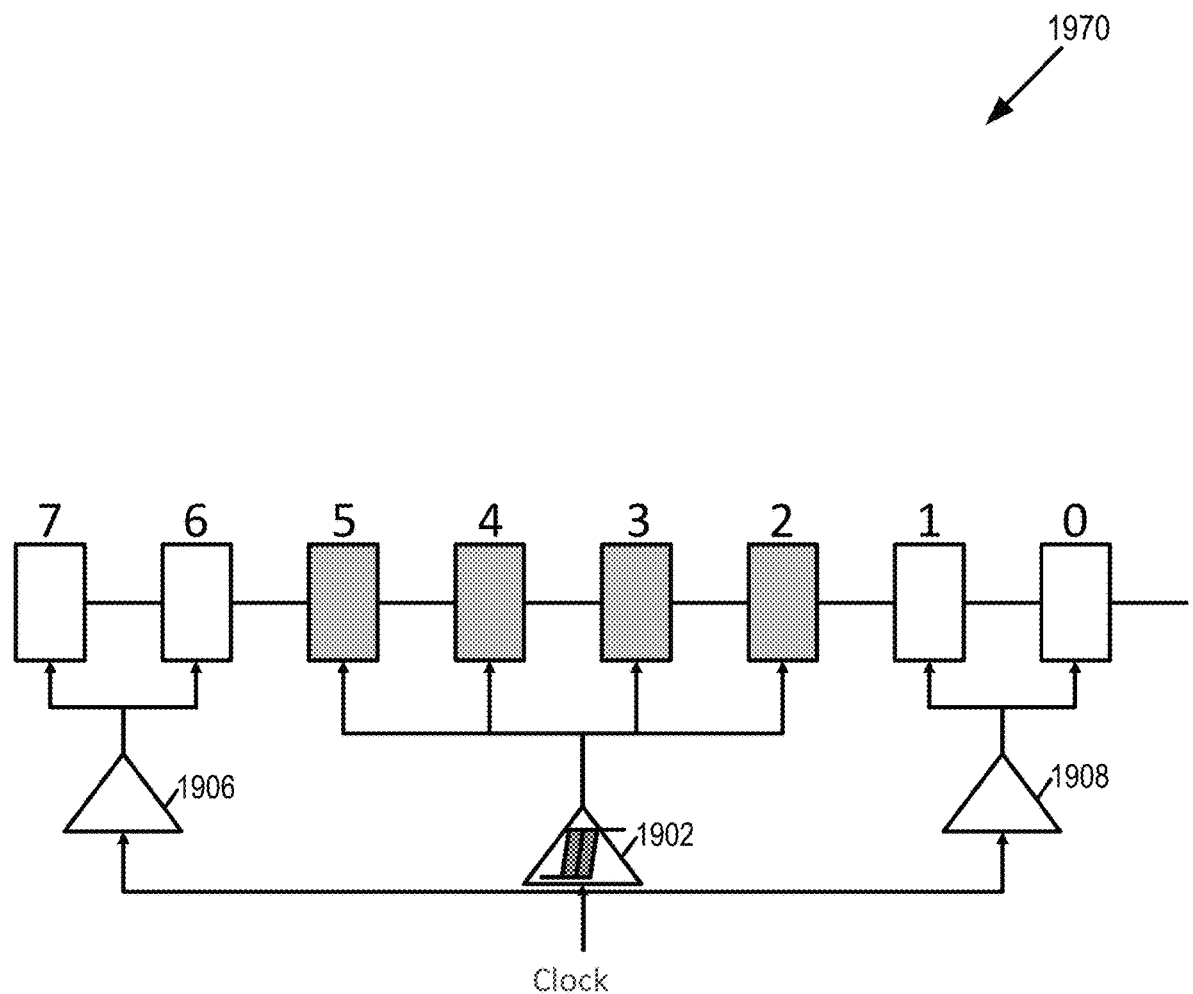

FIG. 18A illustrates a flow chart 1800 for testing U-turn scan chain patterns and/or Z-turn scan chain patterns in order to a location and/or a type of defect. At 1802, U-turn scan chain pattern test(s) and/or Z-turn scan chain pattern test(s) are performed in order to determine locations of error values within the scan cells resulting from the test(s). As discussed above, various types of sequences of U-turn scan chain patterns and/or Z-turn scan chain patterns may be tested, with the results of the tests being used to identify errors within the cells of the scan chain. At 1804, based on a rule-based analysis of the location of the error values within the scan cells resulting from the test(s), a type and/or a location of the defect may be identified. For example, a series of U-turn scan chain patterns and Z-turn scan chain patterns may be performed, such as illustrated in FIGS. 17A-B. Likewise, a series of U-turn scan chain patterns may be performed, such as illustrated in FIGS. 19A-C. Based on the series of scan chain patterns tested, errors may be identified within the scan cells. The errors may then be analyzed, such as using a rule-based approach, in order to determine a type and/or a location of the defect. For example, with regard to FIGS. 17A-B, the errors resulting from the series of scan chain patterns tested may identify a type of defect (e.g., hold time fault) and a location of the defect (e.g., between scan cells 2 and 3). Likewise, with regard to FIGS. 19A-C (discussed below), the errors resulting from the series of scan chain patterns tested may identify a type of defect (e.g., clock defect) and a location of the defect (e.g., the clock that drives scan cells 2-5).

Figure 18B:
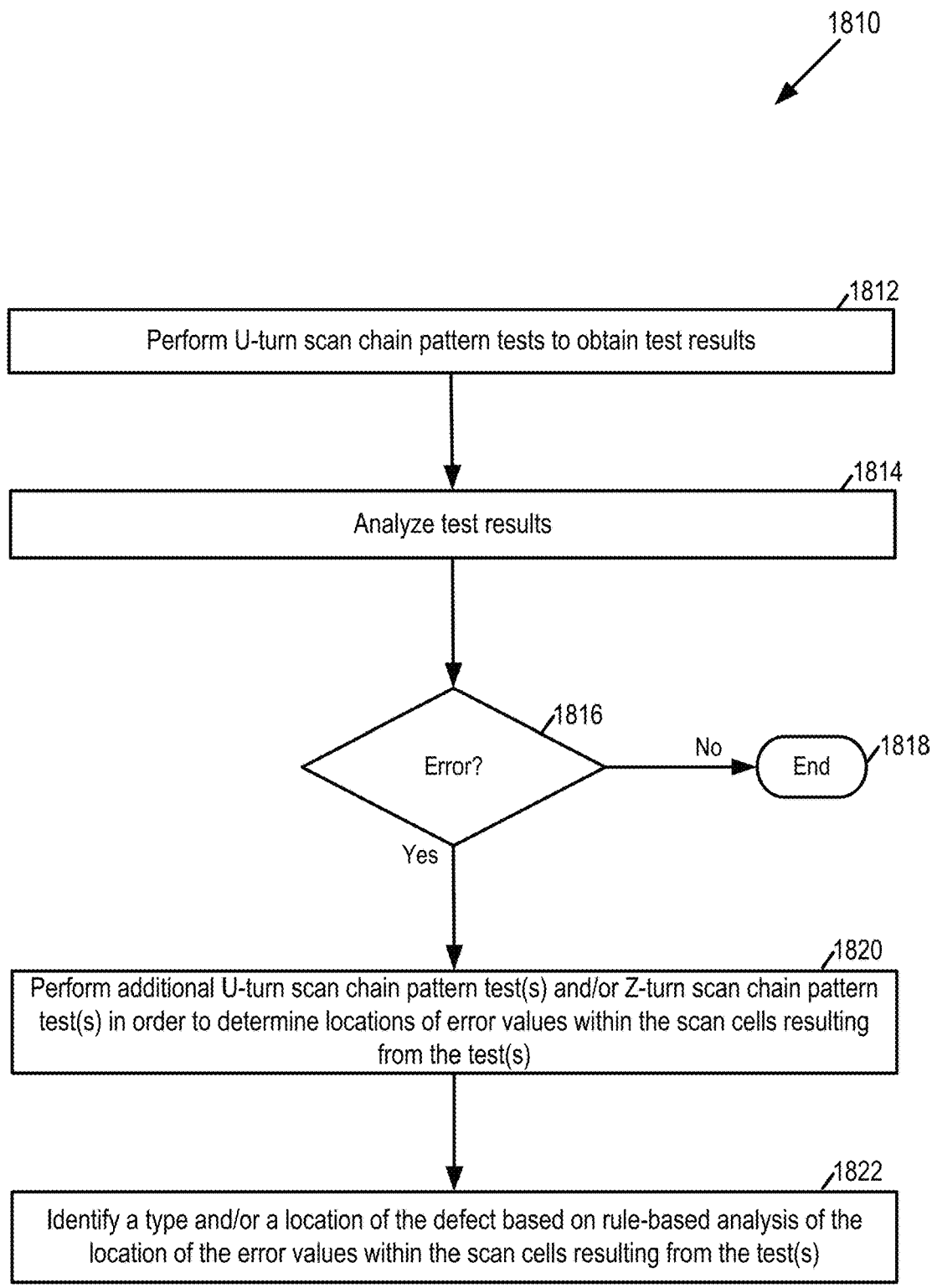
FIG. 18B illustrates a flow chart for testing using U-turn scan chain patterns to identify an error, and using additional U-turn scan chain pattern(s) and/or Z-turn scan chain pattern(s) to identify the location and/or the type of defect.

FIG. 18B illustrates a flow chart 1810 for testing using U-turn scan chain patterns to identify an error, and using additional U-turn scan chain pattern(s) and/or Z-turn scan chain pattern(s) to identify the location of the defect. As discussed above, a U-turn scan chain pattern may be used to identify an error value in a specific cell in the scan chain. See FIGS. 10, 17A-B, 19A-C. Subsequent U-turn and/or Z-turn scan chain patterns may further be tested in order identify errors in the scan chain cells (which may in turn be analyzed to determine a type and/or a location of the defect). At 1812, U-turn scan chain pattern tests are performed in order to obtain test results. At 1814, the test results are analyzed in order to determine at 1816 whether there is an error that is identified in the test results. If no error is identified, flow chart 1810 ends at 1818. If there is an error identified, at 1820, additional U-turn scan chain pattern test(s) and/or Z-turn scan chain pattern test(s) are performed. At 1822, the test results may be analyzed to identify a type and/or a location of the defect.

Figure 18C:
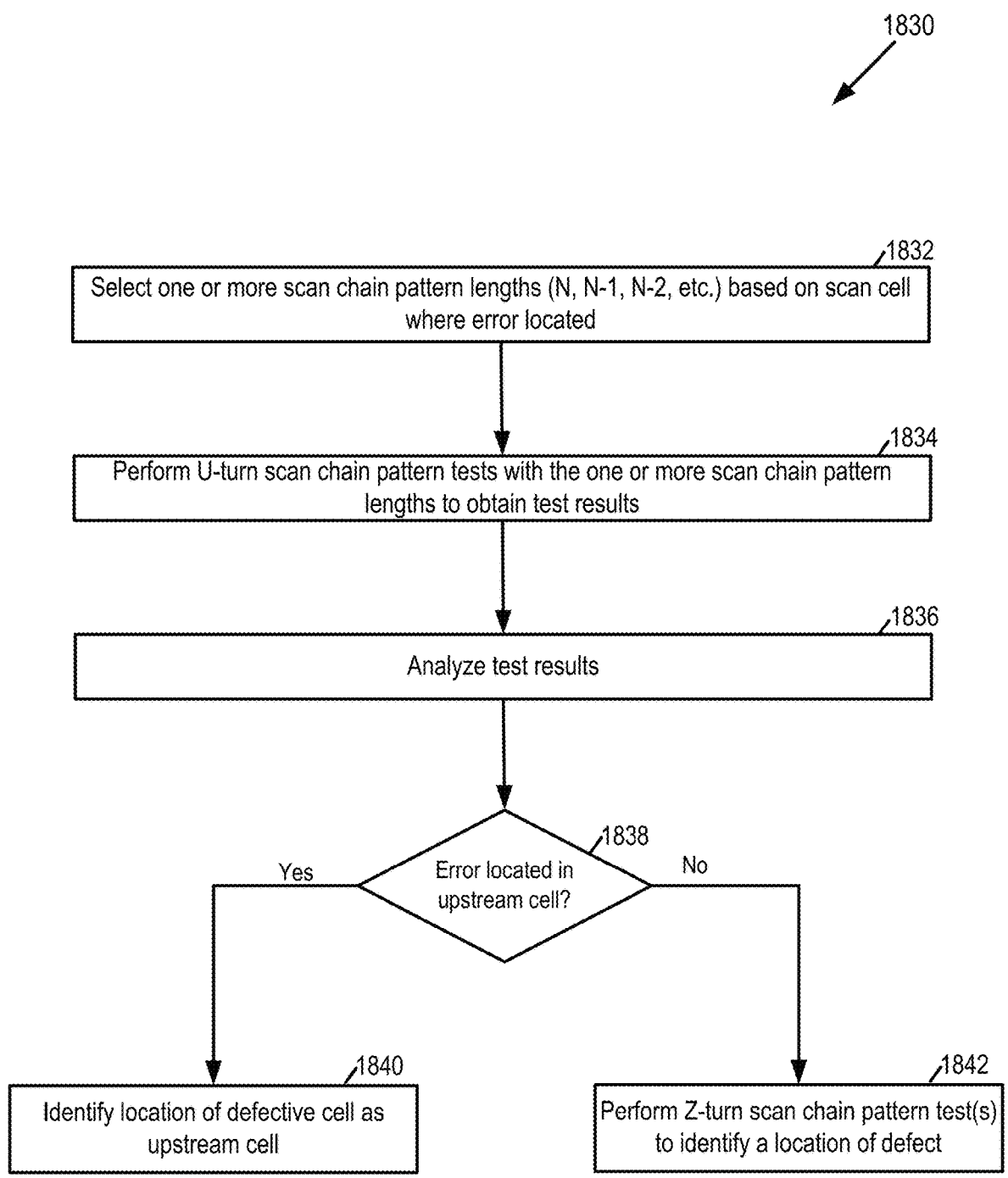
FIG. 18C illustrates using a flow chart for using the additional U-turn scan chain pattern(s) to identify the location of the defect.

FIG. 18C illustrates using a flow chart 1830 for using the additional U-turn scan chain pattern(s) to identify the location of the defect. Responsive to identifying an error value associated with a specific cell (e.g., the Nth cell) in the scan chain, at 1832, the system may select one or more scan chain pattern lengths (e.g., for a L2R/R2L scan chain that identifies the error, cells that are upstream are lower numbered cells, such as N−1, N−2, etc.; for a R2L/L2R scan chain that identifies the error, cells that are upstream are higher numbered cells, such as N+1, N+2, etc.) based on scan cell where error located (e.g., based on identifying the error value associated with the Nth cell). At 1834, U-turn scan chain pattern tests with the one or more scan chain pattern lengths (e.g., for a L2R/R2L scan chain, N−1, N−2, etc.; for a R2L/L2R scan chain, N+1, N+2, etc.) are performed in order to obtain test results. At 1836, the test results are analyzed. At 1838, it is determined whether there is an error in the upstream cell. If so, at 1840, the upstream cell is identified as the defect cell. If not, at 1842, Z-turn scan chain pattern test(s) are performed to identify a location of defect external to one of the cells in the scan chain.

For example, in a 100 cell scan chain, U-turn pattern testing may identify an error value in the $70^{th}$ cell in the scan chain. Thereafter, the system may send U-turn pattern(s) to test cells in the neighborhood of the $70^{th}$ cell. For example, responsive to a L2R/R2L U-turn identifying the error, one or more cells before the $70^{th}$ cell (e.g., the $69^{th}$ cell, the $68^{th}$ cell, etc.) may be tested by selecting L2R/R2L U-turn patterns with a predefined scan chain pattern length (e.g., a U-turn with 69 scan chain pattern length to test the $69^{th}$ cell; a U-turn with 68 scan chain pattern length to test the $68^{th}$ cell; etc.). Thus, responsive to a L2R/R2L U-turn pattern with 69 scan chain pattern length identifying the $69^{th}$ cell as having an error, the system may identify the $69^{th}$ cell as being defective. As another example, responsive to a R2L/L2R U-turn identifying the error, one or more cells after the $70^{th}$ cell (e.g., the $71^{th}$ cell, the $72^{nd}$ cell, etc.) may be tested by selecting R2L/L2R U-turn patterns with a predefined scan chain pattern length (e.g., a U-turn with 29 scan chain pattern length to test the $71^{th}$ cell in R2L/L2R; a U-turn with 28 scan chain pattern length to test the $72^{nd}$ cell in R2L/L2R; etc.).

Figure 18D:
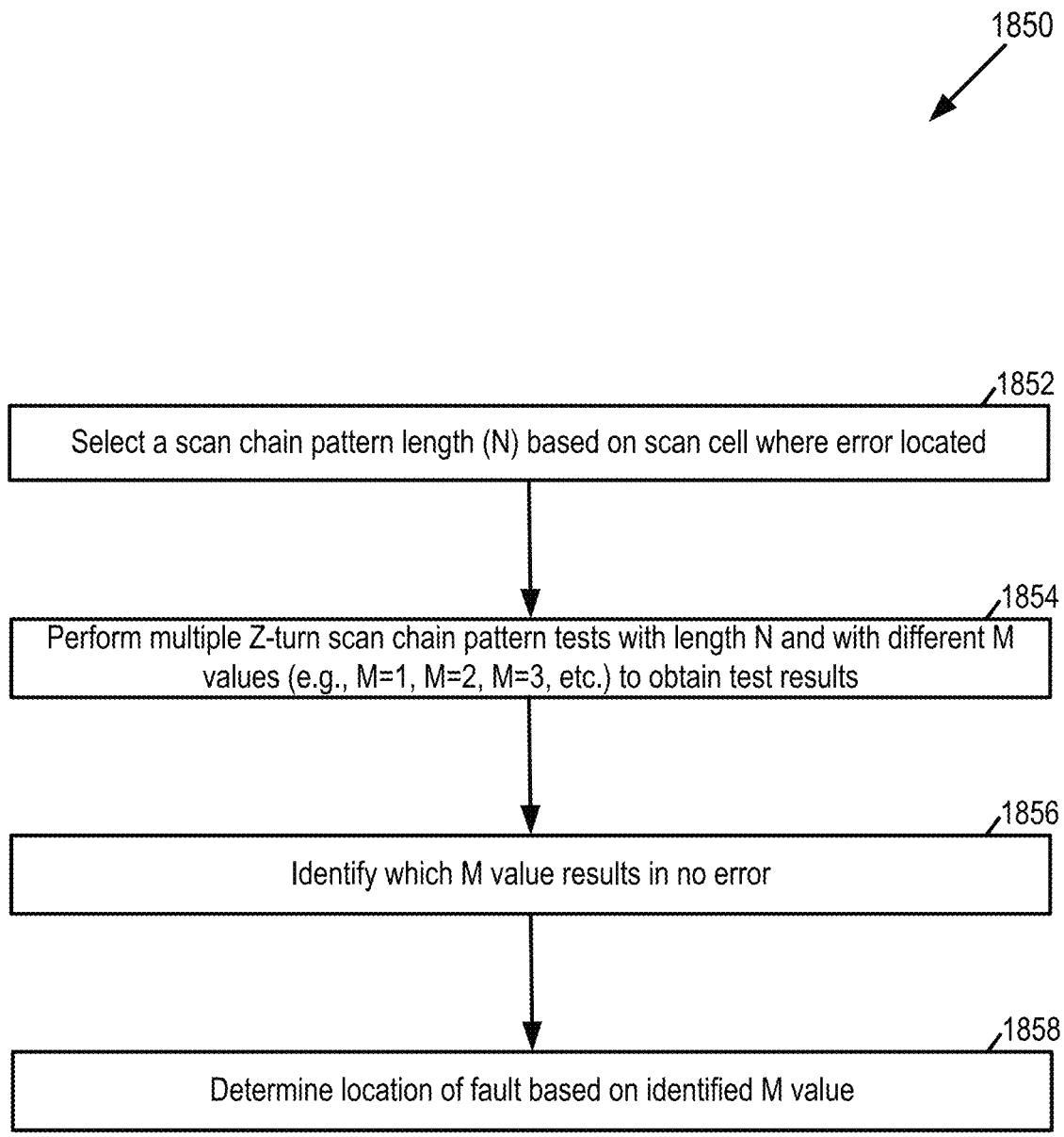
FIG. 18D illustrates using a flow chart for using the additional Z-turn scan chain pattern(s) to identify the location of the defect.

FIG. 18D illustrates using a flow chart 1850 for using the additional Z-turn scan chain pattern(s) to identify the location of the defect. At 1852, a scan chain pattern length of N is selected based on scan cell where error located. In the example given above, responsive to a U-turn pattern identifying the error in the $70^{th}$ cell, a scan chain pattern length of 70 is selected. At 1854, multiple Z-turn scan chain pattern tests with length N and with different M values (e.g., M=1, M=2, M=3, etc.) are performed to obtain test results.

For example, in the instance where a L2R/R2L scan identified the error in the $70^{th}$ cell, a $LRLR_{70\_pattern\_length \leftarrow 1}$ test pattern, a $LRLR_{70\_pattern\_length \leftarrow 2}$ test pattern, a $LRLR_{70\_pattern\_length \leftarrow 3}$ test pattern, etc. may be used. Further, the value injected in the second turn of the Z-pattern may be dependent on the value of the neighboring cell. In particular, $LRLR_{70\_pattern\_length \leftarrow 1}$ comprises a Z-pattern with a first turn from L2R with a scan chain pattern length of 70, a second turn from R2L with a scan chain pattern length of 1 (with the value injected as the value of the $71^{st}$ cell), and a third turn from L2R with a scan chain pattern length of 70. As another example, $LRLR_{70\_pattern\_length \leftarrow 2}$ comprises a Z-pattern with a first turn from L2R with a scan chain pattern length of 70, a second turn from R2L with a scan chain pattern length of 2 (with the value injected as the value of the $71^{st}$ cell and $72^{nd}$ cell), and a third turn from L2R with a scan chain pattern length of 70.

As another example, in the instance where a R2L/L2R scan identified the error in the $70^{th}$ cell (of 100 cells in the scan chain), a $RLRL_{30\_pattern\_length \leftarrow 1}$ test pattern, a $RLRL_{30\_pattern\_ljength \leftarrow 2}$ test pattern, a $RLRL_{30\_pattern\_length \leftarrow 3}$ test pattern, etc. may be used. Further, the value injected in the second turn of the Z-pattern may be dependent on the value of the neighboring cell. In particular, $RLRL_{30\_pattern\_length \leftarrow 1}$ comprises a Z-pattern with a first turn from R2L with a scan chain pattern length of 30, a second turn from L2R with a scan chain pattern length of 1 (with the value injected as the value of the $69^{th}$ cell), and a third turn from R2L with a scan chain pattern length of 70. As another example, $RLRL_{30\_pattern\_length\leftarrow 2}$ comprises a Z-pattern with a first turn from R2L with a scan chain pattern length of 30, a second turn from L2R with a scan chain pattern length of 2 (with the value injected as the value of the $68^{th}$ cell and $69^{th}$ cell), and a third turn from R2L with a scan chain pattern length of 70.

At 1856, the system identifies which M value results in no error. At 1858, the system may determine the location of the fault (e.g., the hold time fault) based on the M value that results in no error.

As discussed above, if the M-shift passes through the cells with the hold time error, the error may be eliminated; otherwise, the error remains. This is illustrated in FIGS. 17A-B, wherein a shift of M=1 results in an error still being present (meaning the M-shift did not shift past the cells with the hold time error), whereas M=2 results in no error being present (meaning the M-shift did shift past the cells with the hold time error). Further, as discussed above, because the error value was in cell 1 and because M=2 shift R2L was identified as resulting in no error means that the hold time fault is between the cells 2 and 3.

Similarly, consider the example above where a L2R/R2L scan identified the error in the $70^{th}$ cell and multiple Z-turns are used (e.g., a $LRLR_{70\_pattern\_length\leftarrow 1}$ test pattern, a $LRLR_{70\_pattern\_length\leftarrow 2}$ test pattern, a $LRLR_{70\_pattern\_length\leftarrow 3}$ test pattern): responsive to identifying that using a $LRLR_{70\_pattern\_length\leftarrow 1}$ test pattern (where M=1, meaning a shift right of 1) still results in an error, and responsive to identifying that using a $LRLR_{70\_pattern\_length\leftarrow 2}$ test pattern (where M=2, meaning a shift right of 2) results in no error, the system may determine that the defect lies between cells 68 and 69. Likewise, consider the example above where a R2L/L2R scan identified the error in the $70^{th}$ cell and multiple Z-turns are used (e.g., a $RLRL_{30\_pattern\_length\leftarrow 1}$ test pattern, a $RLRL_{30\_pattern\_length\leftarrow 2}$ test pattern, a $RLRL_{30\_pattern\_length\leftarrow 3}$ test pattern): responsive to identifying that using a $RLRL_{30\_pattern\_length\leftarrow 1}$ test pattern (where M=1, meaning a shift left of 1) still results in an error, that using a $RLRL_{30\_pattern\_length\leftarrow 2}$ test pattern (where M=2, meaning a shift left of 2) results in an error, and that that using a $RLRL_{30\_pattern\_length\leftarrow 3}$ test pattern (where M=3, meaning a shift left of 3) results in no error, the system may determine that the defect lies between cells 72 and 73.

Multiple hold-time faults per chain and singled-sided fault, such as fast-to-rise (e.g., that only corrupts "10" transitions) or fast-to-fall (e.g., that only corrupts "01" transitions) may likewise be detected. In particular, the above-referenced algorithms may be adapted such that a pair of Z-turn patterns may be used to bound the defect location if some faulty transitions pass the defect location in one pattern, but they do not pass the defect location in another pattern.

Diagnosing the hold-time defects of type (A.2) (e.g., the defect is on the scan path that only impacts unidirectional shift path) is more straightforward. The system may shift in transitions correctly by using the shift direction without passing through the defect location. Then, the system may switch the shift direction and shift out the transitions to diagnose the defect location.

Diagnosing the hold time defects of type (B) (e.g., due to extra clock skews) may also be performed. Various errors may be caused by a delayed clock, such as illustrated in FIGS. 19A-C. For example, clock skews may be caused by slow clock gater. Specifically, the block diagram 1900 in FIG. 19A illustrates a defect in the clock 1902. For example, when loading from left to right, clock 1902 may be slower than the clock 1906 that drives cells 6 and 7. Because of the different timing of the clocks, this defect in the clock 1902 may behave and appear to be a hold time error between cells 6 and 5 (shown as 1904) when performing the scan chain shifting because the clock on scan cell 5 is slower than the clock driving scan cell 6. Likewise, because clock 1902 is slower than clock 1908 (e.g., if the delay on the clock 1902 is bigger than the setup time margin), a setup time defect will appear between cells 2 and 1.

Further, in the block diagram 1950 in FIG. 19B, which loads right to left, clock 1902 may be slower than the clock 1908 that drives cells 0 and 1. Because of the different timing of the clocks, this defect in the clock 1902 may behave and appear to be a hold time error between cells 1 and 2 (shown as 1904) when performing the scan chain shifting because the clock on scan cell 2 is slower than the clock driving scan cell 1. Likewise, because clock 1902 is slower than clock 1906 (e.g., if the delay on the clock 1902 is bigger than the setup time margin), a setup time defect will appear between cells 5 and 6. Thus, there is an identifiable sequence of errors in loading left to right (apparent hold time error between cells 5 and 6 and setup time error between cells 1 and 2) or in loading right to left (apparent hold time error between cells 1 and 2 and setup time error between cells 5 and 6) so that the clock 1902, which drives cells 2-5 may be identified based on rules that indicative the identifiable sequence of errors is due to clock 1902. In this way, based on the scan chain patterns tested and a rule-based methodology, the system may determine whether the fault is due to a hold time fault and/or delayed clock fault (e.g., one or both of the hold time fault and the delayed clock fault may be present).

The block diagram 1970 in FIG. 19C thus illustrates the conclusion that a slow clock gater, driving a segment of consecutive scan cells from Cell 2 to Cell 5, is the defect. All other scan cells are driven by the normal clock signals. In particular, all the cells from Cell 2 to Cell 5 share the same "delayed clock"; hence, there are no hold-time defects between these scan cells. In other words, there is only one hold-time fault on this faulty chain, although multiple cells are affected. The system may identify the one hold-time fault based on this information. This behavior is considerably different from a clock defect causing scan cell stuck-at faults, in which every scan cell will be impacted by the defective clock. In such a situation, the previous disclosed Z-turn patterns may also be used. However, the patterns may be carefully designed based on the number of consecutive cells drive by each clock gater.

Figure 20A:
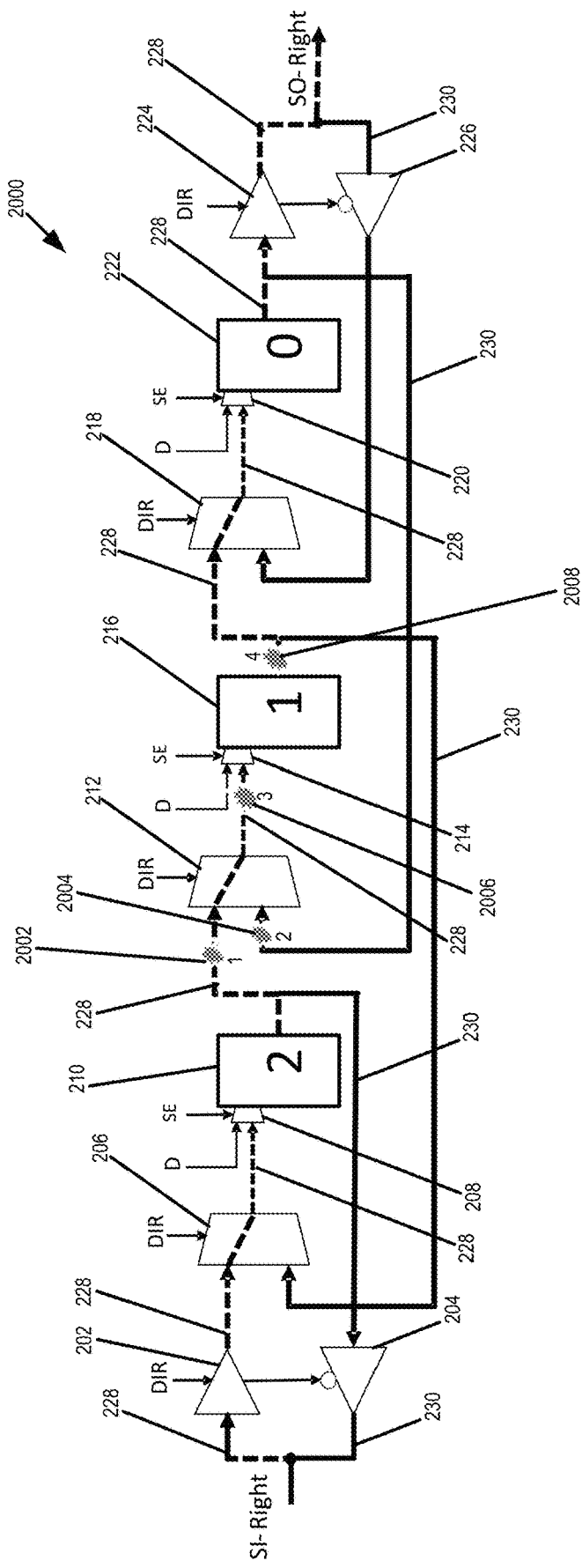
FIG. 20A illustrates a block diagram to consider different fault locations.
Figure 20B:
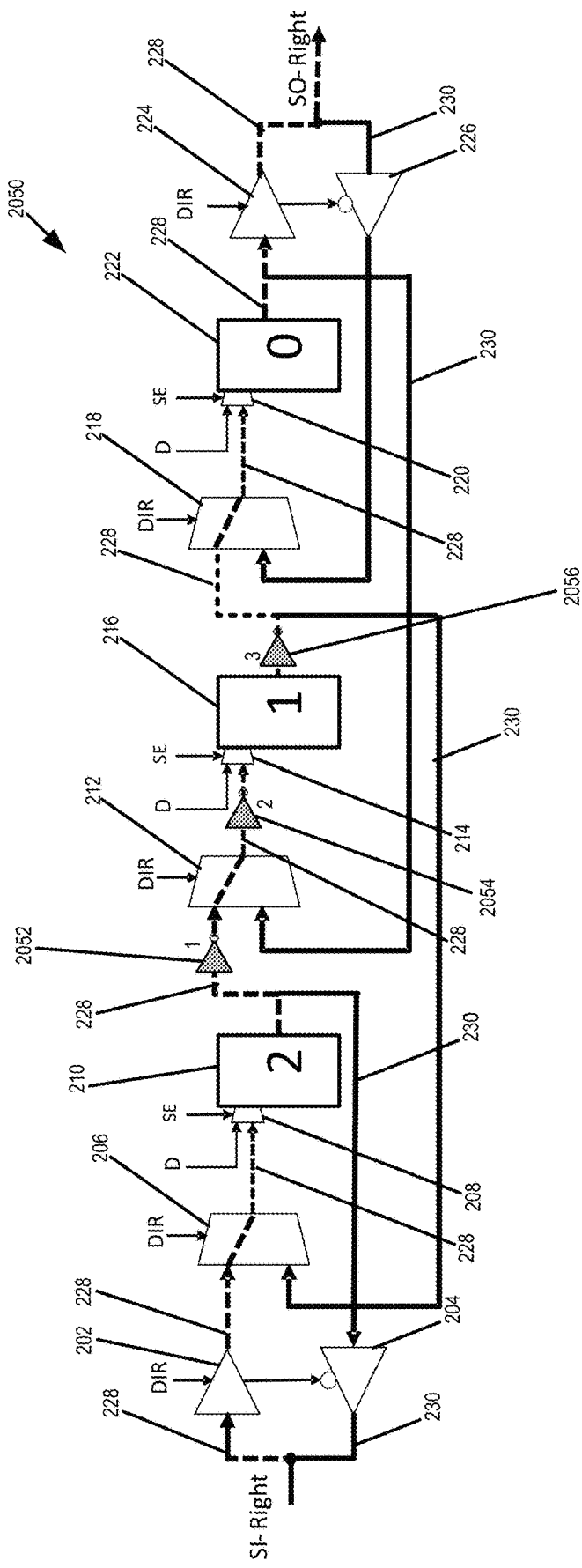
FIG. 20B illustrates a block diagram to consider different inverter locations.

The system may further consider different fault locations, such as illustrated in block diagram 2000 in FIG. 20A. For example, faults may be present in the scan cell architecture, such as faults 2002 (fault 1), 2004 (fault 2), 2006 (fault 3), and 2008 (fault 4). The system may identify the faults as unidirectional faults, such as 2002 (fault 1), 2004 (fault 2), 2006 (fault 3), or identify the faults as bidirectional faults, such as 2008 (fault 4). Specifically, as discussed above, based on testing for different directions of U-turn patterns (e.g., R2L/L2R; L2R/R2L), the system may identify whether the fault is identified in only one testing direction (e.g., in one of R2L/L2R or L2R/R2L, but not both resulting in a conclusion that the fault is unidirectional) or whether the fault is identified in both testing directions (in both of R2L/L2R and L2R/R2L resulting in a conclusion that the fault is bidirectional). In turn, responsive to identifying one or more fault locations, the system may consider modifications of the circuitry, such as considering different locations for inverters, such as illustrated in block diagram 2050 of FIG. 20B. In particular, inverters, such as inverter 1 (2052), inverter 2 (2054), and inverter 3 (2056), may be placed in the scan cell architecture.

Thus, the system may identify single and/or multiple stuck-at and/or timing faults in the scan cell architecture. Further, the system may identify defect locations in different portions of the scan cell architecture, such as at the cells and/or at specific locations (e.g., DIR and/or clock buffer). Further, the defects detected may impact single and/or both shift directions. Finally, the system may consider modifications, such as inverter location(s) along the scan paths.

The following example embodiments of the invention are also disclosed:

Embodiment 1

A method of scan chain diagnosis, the method comprising:
loading a scan cell network with one or more scan chain patterns;
unloading the scan cell network to collect scan chain test data;
analyzing the scan chain test data in order to identify a timing fault in the scan cell network; and
responsive to the analysis, identifying whether there is the timing fault in the scan cell network.

Embodiment 2

The method of embodiment 1,
wherein the timing fault comprises at least one of: transition fault; delay fault; or hold time fault.

Embodiment 3

The method of any of embodiments 1 and 2,
wherein the scan cell network comprises a one-dimensional scan cell network.

Embodiment 4

The method of any of embodiments 1-3,
wherein the scan cell network comprises a two-dimensional scan cell network.

Embodiment 5

The method of any of embodiments 1-4,
wherein the scan chain pattern comprises at least a three-turn pattern comprising at least a first turn, a second turn, and a third turn, wherein at least one of the first turn, the second turn, or the third turn has a different direction than a remainder of patterns in the three-turn pattern.

Embodiment 6

The method of any of embodiments 1-5,
wherein the scan cell network comprises a one-dimensional scan cell network;
wherein the first turn and the third turn are in a first direction; and
wherein the second turn is in a second direction opposite the first direction.

Embodiment 7

The method of any of embodiments 1-6,
wherein the first turn and the third turn each shift N cycles;
wherein the second turn shifts M cycles; and
wherein M is not equal to N.

Embodiment 8

The method of any of embodiments 1-7,
wherein M<N such that the three-turn pattern comprises a Z-turn pattern; and
wherein analysis of the scan chain test data collected responsive to the Z-turn pattern is used to determine the timing fault.

Embodiment 9

The method of any of embodiments 1-8,
wherein the scan cell network comprises a two-dimensional scan cell network;
wherein at least one of the first turn, the second turn, or the third turn are in a vertical direction and a remainder of turns of the scan chain pattern are in a horizontal direction; and
wherein analysis the scan chain test data collected responsive to the three-turn pattern is used to determine the timing fault.

Embodiment 10

The method of any of embodiments 1-9,
wherein the timing fault comprises a scan path delay that is too small.

Embodiment 11

The method of any of embodiments 1-10,
wherein identifying whether there is the timing fault in the scan cell network comprises identifying whether the scan path delay that is too small is on a scan path that is shared by bidirectional shift paths.

Embodiment 12

The method of any of embodiments 1-11,
wherein identifying whether there is the timing fault in the scan cell network comprises identifying whether the scan path delay that is too small is on a scan path that is only used by unidirectional shift path.

Embodiment 13

The method of any of embodiments 1-12,
wherein the timing fault comprises a clock skew is too large; and
wherein identifying whether there is the timing fault in the scan cell network comprises:
diagnosing defective scan cells; and
based on the diagnosis, identify a real defect location indicative that the clock skew is too large.

Embodiment 14

The method of any of embodiments 1-13, wherein the one or more scan chain patterns loaded comprises a plurality of U-turn or Z-turn patterns; and wherein responsive to the analysis, a type of timing fault is identified in the scan cell network.

Embodiment 15

The method of any of embodiments 1-14, wherein the scan chain test data is indicative of error values at locations within scan cells of the scan cell network wherein the analysis comprises a rule-based analysis of the scan chain test data in order to determine the type of timing fault and a location of the timing fault.

Embodiment 16

One or more non-transitory computer-readable media storing computer-executable instructions for causing one or more processors performance of a method according to any of embodiments 1-15.

Embodiment 17

A system, comprising: one or more processors, the one or more processors programmed to perform a method according to any of embodiments 1-15.

Embodiment 18

A method of scan chain diagnosis, the method comprising:

loading a scan cell network with one or more scan chain patterns;

unloading the scan cell network to collect scan chain test data;

analyzing the scan chain test data in order to identify a stuck-at fault in a global signal in the scan cell network; and responsive to the analysis, identifying whether there is the stuck-at fault in the global signal in the scan cell network.

Embodiment 19

The method of embodiment 18, wherein the stuck-at fault is on a scan path that is shared by bidirectional shift paths.

Embodiment 20

The method of any of embodiments 18 and 19, wherein the stuck-at fault is on an output pin of a MUX controlled by DIR or on a scan cell output before fanout to different paths.

Embodiment 21

The method of any of embodiments 18-20, wherein the stuck-at fault is on a scan path that is only used by unidirectional shift.

Embodiment 22

One or more non-transitory computer-readable media storing computer-executable instructions for causing one or more processors performance of a method according to any of embodiments 18-21.

Embodiment 23

A system, comprising: one or more processors, the one or more processors programmed to perform a method according to any of embodiments 18-21.

Embodiment 24

A method of scan chain diagnosis using an adaptive chain pattern length, the method comprising:

loading a section of a scan cell network with one or more first scan chain patterns having a first chain pattern length;

unloading the section of the scan cell network to collect first chain test data responsive to loading the scan cell network with the one or more first scan chain patterns;

selecting a second chain pattern length, the second chain pattern length being different from the first chain pattern length;

loading the section of the scan cell network with one or more second scan chain patterns having the second chain pattern length;

unloading the section of the scan cell network to collect second chain test data responsive to loading the scan cell network with the one or more second scan chain patterns; and analyzing the first chain test data and the second chain test data in order to identify a fault in the section of the scan cell network.

Embodiment 25

The method of embodiment 24, further comprising selecting a third chain pattern length, the third chain pattern length being different from the first chain pattern length and the second chain pattern length; and wherein the third chain pattern length selected is dependent on the analysis of one or both of the first chain test data and the second chain test data.

Embodiment 26

The method of any of embodiments 24 and 25, wherein responsive to determining that the first chain test data is not indicative of the fault in the section of the scan cell network and to determining that the second chain test data is indicative of the fault in the section of the scan cell network, selecting the third chain pattern length to be between the first chain pattern length and the second chain pattern length; and wherein responsive to determining that the first chain test data and the second chain test data are not indicative of the fault in the section of the scan cell network, selecting the third chain pattern length to be greater than both the first chain pattern length and the second chain pattern length.

Embodiment 27

One or more non-transitory computer-readable media storing computer-executable instructions for causing one or more processors performance of a method according to any of embodiments 24-26.

Embodiment 28

A system, comprising: one or more processors, the one or more processors programmed to perform a method according to any of embodiments 24-26.

Embodiment 29

A method of scan chain diagnosis, the method comprising:
loading a scan cell network with one or more two-turn scan chain patterns;
unloading the scan cell network to collect scan chain test data responsive to loading the scan cell network with one or more two-turn scan chain patterns;
loading a scan cell network with one or more at least three-turn scan chain patterns; unloading the scan cell network to collect scan chain test data responsive to loading the scan cell network with one or more at least three-turn scan chain patterns; and
analyzing the scan chain test data in order to identify a fault in the scan cell network.

Embodiment 30

The method of embodiment 29,
wherein analyzing the scan chain test data responsive to loading the scan cell network with one or more two-turn scan chain patterns comprises identifying an error based on the scan chain test data; and
responsive to identifying the error, performing the following in order to identify at least one of a type of the fault or a location of the fault:
loading the scan cell network with the one or more at least three-turn scan chain patterns; and
unloading the scan cell network to collect the scan chain test data responsive to loading the scan cell network with one or more at least three-turn scan chain patterns; and
wherein analyzing the scan chain test data responsive to loading the scan cell network with one or more at least three-turn scan chain patterns comprises identifying the type of the fault or the location of the fault.

Embodiment 31

The method of any of embodiments 29 and 30,
wherein the at least three-turn scan chain pattern comprising at least a first turn, a second turn, and a third turn;
wherein the first turn and the third turn are in a first direction and each shift N cycles;
wherein the second turn is in a second direction opposite the first direction and shifts M cycles; and
wherein multiple at least three-turn patterns with different M values are tested in order to identify the type of the fault or the location of the fault.

Embodiment 32

One or more non-transitory computer-readable media storing computer-executable instructions for causing one or more processors performance of a method according to any of embodiments 29-31.

Embodiment 33

A system, comprising: one or more processors, the one or more processors programmed to perform a method according to any of embodiments 29-31.

The above disclosed subject matter is to be considered illustrative, and not restrictive, and the appended claims are intended to cover all such modifications, enhancements, and other embodiments, which fall within the true spirit and scope of the description. Thus, to the maximum extent allowed by law, the scope is to be determined by the broadest permissible interpretation of the following claims and their equivalents, and shall not be restricted or limited by the foregoing detailed description.

REFERENCES

The following references are hereby incorporated by reference herein in their entirety:
C. Hess, "Device Array Scribe Characterization Vehicle Test Chip for Ultra Fast Product Wafer Variability Monitoring", Intl. Conference on Microelectronic Test Structures, 2007, pp. 145-149.
D. K. Bhaysar et al., "A Highly Testable and Diagnosable Fabrication Process Test Chip", ITC, 1998, pp. 853-861.
M. Karthikeyan, et al. "Short-flow test chip utilizing fast testing for defect density monitoring in 45 nm", International Conference on Microelectronic Test Structures, 2008, pp. 56-61.
Mehdi Vaez-Iravani et al., "Defect Detection System", US Patent, Pub. No.: US 2005/0018181A1.
Y. Huang et al., "Industrial Advancements in Diagnosis Driven Yield Analysis," IEEE ETS 2015.
Y. Huang and W.-T. Cheng, "On Designing Two-Dimensional Scan Architecture for Test Chips," International Symposium on VLSI Design, Automation and test (VLSI-DAT), 2017.
P. Song, "A New Scan Structure for Improving Scan Chain Diagnosis and Delay Fault Coverage," *Proc. 9th IEEE North Atlantic Test Workshop* (NATW 2007), 2000, pp. 14-18.
"Bidirectional Scan Chain for Digital Circuit Testing," IP.com Number: IPCOM000160595D.
Y. Huang et al., "Diagnose Compound Hold Time Faults Caused by Spot Delay Defects at Clock Tree", International Symposium on Test and Failure Analysis (ISTFA), 2011.

The invention claimed is:
1. A method of scan chain diagnosis, the method comprising:
loading a scan cell network with one or more scan chain patterns, wherein the scan chain patterns comprise at least a three-turn pattern comprising at least a first turn, a second turn, and a third turn, wherein at least one of the first turn, the second turn, or the third turn propagates through scan cells in the scan cell network in a different direction than a remainder of patterns in the three-turn pattern;
unloading the scan cell network to collect scan chain test data;

analyzing the scan chain test data in order to identify a timing fault in the scan cell network; and responsive to the analysis, identifying whether there is the timing fault in the scan cell network.

2. The method of claim 1, wherein the timing fault comprises at least one of: transition fault; delay fault; or hold time fault.

3. The method of claim 1, wherein the scan cell network comprises a one-dimensional scan cell network.

4. The method of claim 1, wherein the scan cell network comprises a two-dimensional scan cell network.

5. The method of claim 1, wherein the scan cell network comprises a one-dimensional scan cell network;
   wherein the first turn and the third turn propagate through the scan cells in the scan cell network in a first direction; and
   wherein the second turn propagate through the scan cells in the scan cell network in a second direction opposite the first direction.

6. The method of claim 5, wherein the first turn and the third turn each shift a first number of cycles;
   wherein the second turn shifts a second number of cycles; and
   wherein the first number of the cycles is not equal to the second number of the cycles.

7. The method of claim 6, wherein the first number of the cycles is not equal to the second number of the cycles such that the three-turn pattern comprises a Z-turn pattern; and
   wherein analysis of the scan chain test data collected responsive to the Z-turn pattern is used to determine the timing fault.

8. The method of claim 1, wherein the scan cell network comprises a two-dimensional scan cell network;
   wherein at least one of the first turn, the second turn, or the third turn propagate through the scan cells in the scan cell network in a first direction and a remainder of turns of the scan chain pattern propagate through the scan cells in the scan cell network in a second direction perpendicular to the first direction; and
   wherein analysis the scan chain test data collected responsive to the three-turn pattern is used to determine the timing fault.

9. The method of claim 1, wherein the timing fault comprises a scan path delay that is smaller than a combination of a hold time, a clock skew, and a clock activation delay.

10. The method of claim 9, wherein identifying whether there is the timing fault in the scan cell network comprises identifying whether the scan path delay that is smaller than the combination of the hold time, the clock skew, and the clock activation delay is on a scan path that is shared by bidirectional shift paths.

11. The method of claim 9, wherein identifying whether there is the timing fault in the scan cell network comprises identifying whether the scan path delay that is smaller than the combination of the hold time, the clock skew, and the clock activation delay is on a scan path that is only used by unidirectional shift path.

12. The method of claim 1, wherein the timing fault comprises a clock skew is larger than a difference between a scan path delay and a combination of combination of a hold time and a clock activation delay; and
   wherein identifying whether there is the timing fault in the scan cell network comprises:
      diagnosing defective scan cells; and
      based on the diagnosis, identify a real defect location indicative that the clock skew is larger than the difference between the scan path delay and the combination of combination of the hold time and the clock activation delay.

13. The method of claim 1, wherein the one or more scan chain patterns loaded comprises a plurality of U-turn or Z-turn patterns; and
   wherein responsive to the analysis, a type of timing fault is identified in the scan cell network.

14. The method of claim 13, wherein the scan chain test data is indicative of error values at locations within scan cells of the scan cell network
   wherein the analysis comprises a rule-based analysis of the scan chain test data in order to determine the type of timing fault and a location of the timing fault.

15. A method of scan chain diagnosis, the method comprising:
   loading a scan cell network with one or more scan chain patterns, wherein the scan chain patterns comprise at least a three-turn pattern comprising at least a first turn, a second turn, and a third turn, wherein at least one of the first turn, the second turn, or the third turn propagates through scan cells in the scan cell network in a different direction than a remainder of patterns in the three-turn pattern;
   unloading the scan cell network to collect scan chain test data;
   analyzing the scan chain test data in order to identify a stuck-at fault in a global signal in the scan cell network; and
   responsive to the analysis, identifying whether there is the stuck-at fault in the global signal in the scan cell network.

16. The method of claim 15, wherein the stuck-at fault is on a scan path that is shared by bidirectional shift paths.

17. The method of claim 16, wherein the stuck-at fault is on an output pin of a multiplexer controlled by direction selection input or on a scan cell output before fanout to different paths.

18. The method of claim 15, wherein the stuck-at fault is on a scan path that is only used by unidirectional shift.

19. A method of scan chain diagnosis using an adaptive chain pattern length, the method comprising:
   loading a first section of a scan cell network with one or more first scan chain patterns having a first chain pattern length;
   unloading the first section of the scan cell network to collect first chain test data responsive to loading the scan cell network with the one or more first scan chain patterns;
   selecting a second chain pattern length, the second chain pattern length being different from the first chain pattern length based on a determination that the first chain test data is not indicative of a fault in the first section of the scan cell network;
   loading a second section of the scan cell network with one or more second scan chain patterns having the second chain pattern length;
   unloading the second section of the scan cell network to collect second chain test data responsive to loading the scan cell network with the one or more second scan chain patterns; and
   analyzing the second chain test data in order to identify whether a fault exists in the second section of the scan cell network.

20. The method of claim 19, further comprising selecting a third chain pattern length, the third chain pattern length being different from the first chain pattern length and the second chain pattern length; and wherein the third chain pattern length selected is dependent on the analysis of one or both of the first chain test data and the second chain test data.

21. The method of claim 20, wherein responsive to determining that the first chain test data is not indicative of the fault in the first section of the scan cell network and to determining that the second chain test data is indicative of the fault in the second section of the scan cell network, selecting the third chain pattern length to be between the first chain pattern length and the second chain pattern length; and wherein responsive to determining that the first chain test data and the second chain test data are not indicative of the fault in the section of the scan cell network, selecting the third chain pattern length to be greater than both the first chain pattern length and the second chain pattern length.

22. A method of scan chain diagnosis, the method comprising:

loading a scan cell network with one or more two-turn scan chain patterns;

unloading the scan cell network to collect scan chain test data responsive to loading the scan cell network with one or more two-turn scan chain patterns;

loading a scan cell network with one or more at least three-turn scan chain patterns;

unloading the scan cell network to collect scan chain test data responsive to loading the scan cell network with one or more at least three-turn scan chain patterns; and analyzing the scan chain test data in order to identify a fault in the scan cell network, wherein analyzing the scan chain test data responsive to loading the scan cell network with one or more two-turn scan chain patterns comprises identifying an error based on the scan chain test data; and responsive to identifying the error, performing the following in order to identify at least one of a type of the fault or a location of the fault:

loading the scan cell network with the one or more at least three-turn scan chain patterns; and unloading the scan cell network to collect the scan chain test data responsive to loading the scan cell network with one or more at least three-turn scan chain patterns; and wherein analyzing the scan chain test data responsive to loading the scan cell network with one or more at least three-turn scan chain patterns comprises identifying the type of the fault or the location of the fault.

23. The method of claim 22, wherein the at least three-turn scan chain pattern comprising at least a first turn, a second turn, and a third turn;

wherein the first turn and the third turn traverse scan cells in the scan cell network in a first direction and each shift a first number of cycles;

wherein the second turn traverse the scan cells in the scan cell network in a second direction opposite to the first direction and shifts a second number of cycles; and wherein multiple at least three-turn patterns with different values are tested in order to identify the type of the fault or the location of the fault.

* * * * *